US012457794B2

(12) United States Patent
Chiu et al.

(10) Patent No.: US 12,457,794 B2
(45) **Date of Patent: *Oct. 28, 2025**

(54) DUAL SIDE CONTACT STRUCTURES FOR SOURCE/DRAIN REGIONS IN SEMICONDUCTOR TRANSISTOR DEVICES AND METHOD OF FORMING

(71) Applicant: Taiwan Semiconductor Manufacturing Company, Ltd., Hsinchu (TW)

(72) Inventors: Shih-Chuan Chiu, Hsinchu (TW); Chia-Hao Chang, Hsinchu (TW); Cheng-Chi Chuang, New Taipei (TW); Chih-Hao Wang, Baoshan Township (TW); Huan-Chieh Su, Tianzhong Township (TW); Chun-Yuan Chen, Hsinchu (TW); Li-Zhen Yu, New Taipei (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/591,290

(22) Filed: Feb. 29, 2024

(65) Prior Publication Data

US 2024/0204046 A1 Jun. 20, 2024

Related U.S. Application Data

(63) Continuation of application No. 17/815,761, filed on Jul. 28, 2022, now Pat. No. 11,955,515, which is a
(Continued)

(51) Int. Cl.
*H10D 84/01* (2025.01)
*H10D 30/67* (2025.01)

(52) U.S. Cl.
CPC ....... *H10D 84/013* (2025.01); *H10D 30/6735* (2025.01)

(58) Field of Classification Search
CPC ............. H01L 29/42392; H01L 29/785; H01L 29/0653; H01L 29/1079; H01L 29/41725;
(Continued)

(56) References Cited

U.S. PATENT DOCUMENTS 9,105,490 B2 8/2015 Wang et al.
9,236,267 B2 1/2016 De et al.
(Continued)

*Primary Examiner* — Changhyun Yi
(74) *Attorney, Agent, or Firm* — Sterne, Kessler, Goldstein & Fox P.L.L.C.

(57) ABSTRACT

A semiconductor device with dual side source/drain (S/D) contact structures and a method of fabricating the same are disclosed. The method includes forming a fin structure on a substrate, forming a superlattice structure on the fin structure, forming first and second S/D regions within the superlattice structure, forming a gate structure between the first and second S/D regions, forming first and second contact structures on first surfaces of the first and second S/D regions, and forming a third contact structure, on a second surface of the first S/D region, with a work function metal (WFM) silicide layer and a dual metal liner. The second surface is opposite to the first surface of the first S/D region and the WFM silicide layer has a work function value closer to a conduction band energy than a valence band energy of a material of the first S/D region.

20 Claims, 27 Drawing Sheets

Related U.S. Application Data continuation of application No. 17/238,983, filed on Apr. 23, 2021, now Pat. No. 11,482,595.

(58) Field of Classification Search
CPC ..... H01L 21/823418; H01L 21/823475; H01L 29/78696; H01L 21/823431; H01L 21/823412; H01L 29/0847; H01L 29/66439; H10D 84/013; H10D 30/6735; H10D 84/038; H10D 84/0149
See application file for complete search history.

(56) References Cited

U.S. PATENT DOCUMENTS

| | | | | |
|---|---|---|---|---|
| 9,236,300 | B2 | 1/2016 | Liaw | |
| 9,406,804 | B2 | 8/2016 | Huang et al. | |
| 9,443,769 | B2 | 9/2016 | Wang et al. | |
| 9,520,482 | B1 | 12/2016 | Chang et al. | |
| 9,548,366 | B1 | 1/2017 | Ho et al. | |
| 9,576,814 | B2 | 2/2017 | Wu et al. | |
| 9,831,183 | B2 | 11/2017 | Lin et al. | |
| 9,859,386 | B2 | 1/2018 | Ho et al. | |
| 11,482,595 | B1 * | 10/2022 | Chiu | H01L 21/823418 |
| 11,955,515 | B2 * | 4/2024 | Chiu | H01L 29/0847 |
| 2019/0006462 | A1 | 1/2019 | Guillorn et al. | |
| 2020/0006230 | A1 * | 1/2020 | Tsai | H01L 23/535 |
| 2020/0294998 | A1 | 9/2020 | Lilak et al. | |
| 2021/0028112 | A1 * | 1/2021 | Kim | H01L 29/41791 |
| 2021/0375722 | A1 | 12/2021 | Kim et al. | |
| 2021/0408246 | A1 * | 12/2021 | Ganguly | H01L 21/02532 |
| 2022/0223698 | A1 * | 7/2022 | Xie | H01L 29/775 |
| 2022/0344464 | A1 | 10/2022 | Chiu et al. | |
| 2023/0008614 | A1 | 1/2023 | Chiu et al. | |

* cited by examiner

DUAL SIDE CONTACT STRUCTURES FOR SOURCE/DRAIN REGIONS IN SEMICONDUCTOR TRANSISTOR DEVICES AND METHOD OF FORMING

CROSS-REFERENCE TO RELATED APPLICATION

This application is a continuation of U.S. patent application Ser. No. 17/815,761, titled "Dual Side Contact Structures in Semiconductor Devices," filed Jul. 28, 2022, which is a continuation of U.S. patent application Ser. No. 17/238,983, titled "Dual Side Contact Structures in Semiconductor Devices," filed Apr. 23, 2021, each of which is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
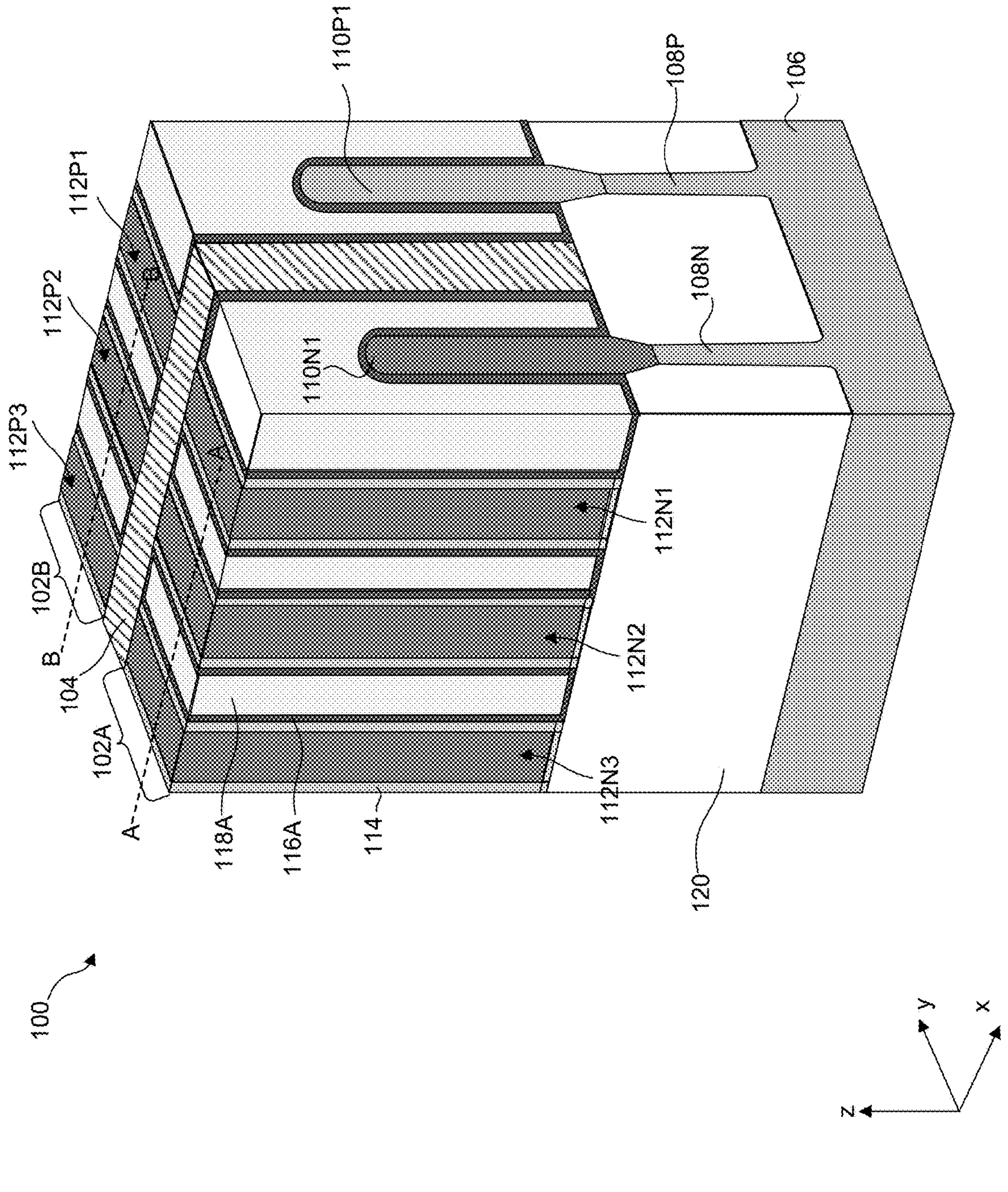
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "nanostructured" defines a structure, layer, and/or region as having a horizontal dimension (e.g., along an X- and/or Y-axis) and/or a vertical dimension (e.g., along a Z-axis) less than, for example, 100 nm.

As used herein, the term "n-type work function metal (nWFM)" defines a metal or a metal-containing material with a work function value closer to a conduction band energy than a valence band energy of a material of a FET channel region and/or a FET source/drain region. In some embodiments, the term "n-type work function metal (nWFM)" defines a metal or a metal-containing material with a work function value less than 4.5 eV.

As used herein, the term "p-type work function metal (pWFM)" defines a metal or a metal-containing material with a work function value closer to a valence band energy than a conduction band energy of a material of a FET channel region and/or a FET source/drain region. In some embodiments, the term "p-type work function metal (pWFM)" defines a metal or a metal-containing material with a work function value equal to or greater than 4.5 eV.

As used herein, the term "electrically inactive structure" refers to a structure that is not electrically coupled to a power supply.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example semiconductor devices (e.g., gate-all-around (GAA) FETs) with dual side source/drain (S/D) contact structures and provides example methods of forming such semiconductor devices with reduced contact resistance between S/D regions and S/D contact structures. The example method forms arrays of epitaxial S/D regions and gate structures on fin structures of NFETs and PFETs of the semiconductor device. In some embodiments, adjacent pairs of S/D regions in the arrays have S/D contact structures that are formed on opposite sides of the semiconductor device. One of the S/D contact structures ("front side S/D contact structure") of the adjacent pairs of S/D regions are formed on a first side ("front side") of the semiconductor device. The other S/D contact structures ("back-side S/D contact structure") of the adjacent pairs of S/D regions are formed on a second side ("back-side") of the semiconductor devices.

The contact resistance between the S/D regions and the S/D contact structures is directly proportional to the Schottky barrier heights (SBHs) between the materials of the S/D regions and the silicide layers of the S/D contact structures. For n-type S/D regions, reducing the difference between the work function value of the silicide layers and the conduction band energy of the n-type material of the S/D regions can reduce the SBH between the n-type S/D regions and the S/D contact structures. In contrast, for p-type S/D regions, reducing the difference between the work function value of the silicide layers and the valence band energy of the p-type material of the S/D regions can reduce the SBH between the p-type S/D regions and the S/D contact structures. In some embodiments, since the epitaxial S/D regions of NFETs and PFETs are formed with respective n-type and p-type materials, the back-side S/D contact structures of NFETs and PFETs are formed with silicide layers different from each other to reduce the contact resistances between the S/D contact structures and the different materials of the S/D regions.

In some embodiments, the NFET S/D contact structures are formed with n-type work function metal (nWFM) silicide layers (e.g., titanium silicide) that have a work function value closer to a conduction band energy than a valence band energy of the n-type S/D regions. In contrast, the PFET S/D contact structures are formed with p-type WFM (pWFM) silicide layers (e.g., nickel silicide) that have a work function value closer to a valence band energy than a conduction band energy of the p-type S/D regions. The nWFM silicide layers can be formed from a silicidation reaction between the n-type S/D regions and an nWFM layer disposed on the n-type S/D regions. The pWFM silicide layers can be formed from a silicidation reaction between the p-type S/D regions and a pWFM layer disposed on the p-type S/D regions. Such selective formation of WFM silicide layers in NFETs and PFETs of semiconductor devices can reduce the contact resistances of the semiconductor devices by about 50% to about 70% and consequently improve the performance of the semiconductor devices.

FIG. 1A illustrates an isometric view of a semiconductor device 100 with NFET 102A and PFET 102B, according to some embodiments. NFET 102A can include an array of gate structures 112N1-112N3 disposed on fin structure 108N, and PFET 102B can include an array of gate structures 112P1-112P3 disposed on fin structure 108P. NFET 102A can further include an array of epitaxial S/D regions 110N1-110N3 (S/D region 110N1 shown in FIG. 1A, 110N2-110N3 shown in FIG. 1B) disposed on portions of fin structure 108N that are not covered by gate structures 112N1-112N3. Similarly, PFET 102B can further include an array of epitaxial S/D regions 110P1-110P3 (S/D region 110P1 shown in FIG. 1A, 110P2-110P3 shown in FIG. 1C) disposed on portions of fin structure 108P that are not covered by gate structures 112P1-112P3.

Semiconductor device 100 can further include isolation structure 104, gate spacers 114, etch stop layer (ESL) 116, interlayer dielectric (ILD) layer 118A, and shallow trench isolation (STI) regions 120. Isolation structure 104 can electrically isolate NFET 102A and PFET 102B from each other. ESL 116 can be configured to protect gate structures 112N1-112N3 and 112P1-112P3 and/or S/D regions 110N1-110N3 and 110P1-110P3. In some embodiments, isolation structure 104, gate spacers 114, and ESL 116 can include an insulating material, such as silicon oxide, silicon nitride (SiN), silicon carbon nitride (SiCN), silicon oxycarbon nitride (SiOCN), and silicon germanium oxide. In some embodiments, gate spacers 114 can have a thickness of about 2 nm to about 9 nm for adequate electrical isolation of gate structures 112N1-112N3 and 112P1-112P3 from adjacent structures. ILD layer 118A can be disposed on ESL 116 and can include a dielectric material.

Semiconductor device 100 can be formed on a substrate 106. Substrate 106 can be a semiconductor material, such as silicon, germanium (Ge), silicon germanium (SiGe), a silicon-on-insulator (SOI) structure, and a combination thereof. Further, substrate 106 can be doped with p-type dopants (e.g., boron, indium, aluminum, or gallium) or n-type dopants (e.g., phosphorus or arsenic). In some embodiments, fin structures 108N-108P can include a material similar to substrate 106 and extend extending an X-axis.

Figure 1C:
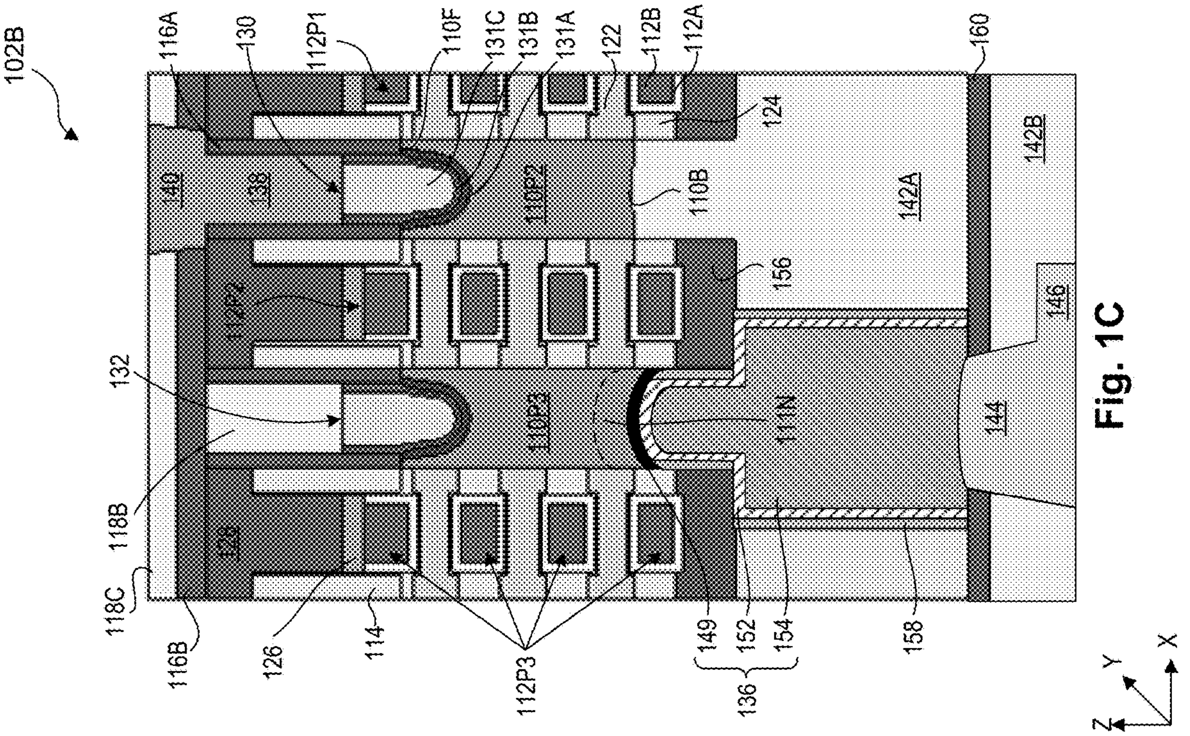
FIGS. 1B-1C illustrate cross-sectional views of a semiconductor device with dual side contact structures, in accordance with some embodiments.
Figure 1B:
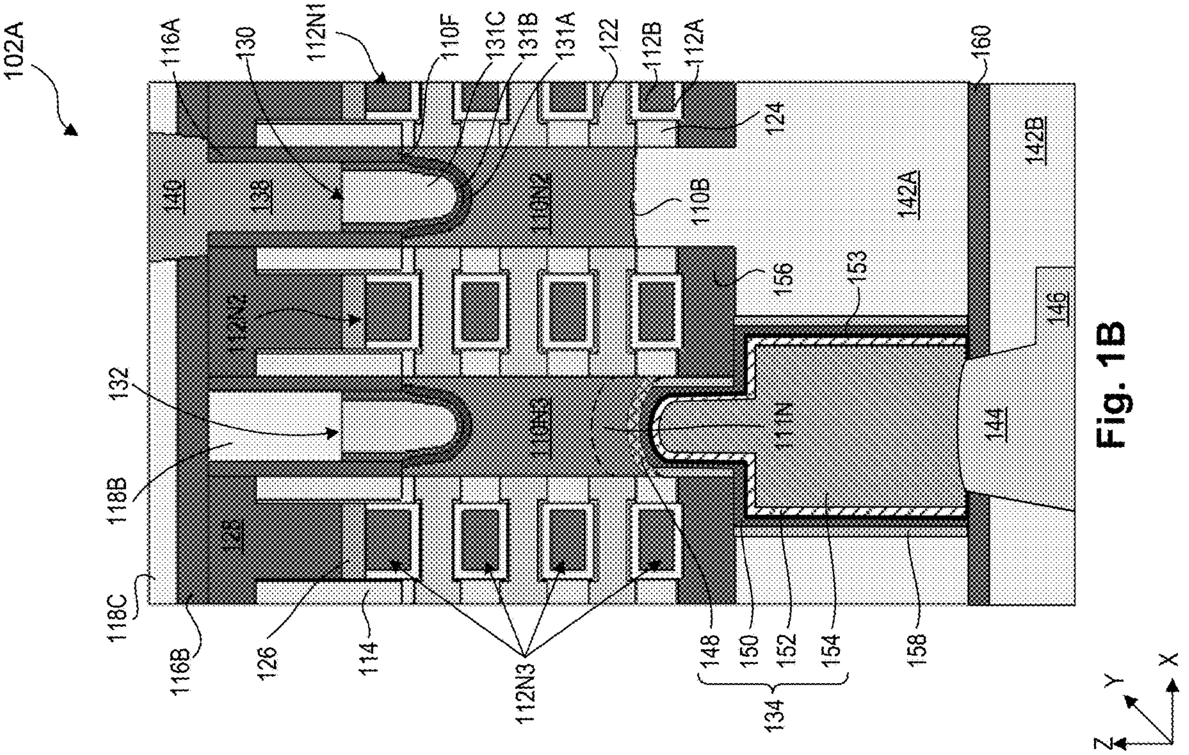

FIGS. 1B-1C illustrate cross-sectional views of semiconductor device 100 along lines A-A and B-B of FIG. 1A. The cross-sectional views in FIGS. 1B-1C illustrate semiconductor device 100 with additional structures that are not shown in FIG. 1A for simplicity. The discussion of elements of NFET 102A and PFET 102B with the same annotations applies to each other, unless mentioned otherwise.

NFET 102A and PFET 102B can include stacks of nanostructured channel regions 122. Nanostructured channel regions 122 can include semiconductor materials similar to or different from substrate 106. In some embodiments, nanostructured channel regions 122 can include (i) an elementary semiconductor, such as Si and Ge; (ii) a compound semiconductor including a III-V semiconductor material; (iii) an alloy semiconductor including SiGe, germanium stannum, or silicon germanium stannum; or (iv) a combination thereof. Though rectangular cross-sections of nanostructured channel regions 122 are shown, nanostructured channel regions 122 can have cross-sections of other geometric shapes (e.g., circular, elliptical, triangular, or polygonal).

Gate structures 112N1-112N3 and 112P1-112P3 can be multi-layered structures. Gate structures 112N1-112N3 and 112P1-112P3 can be wrapped around nanostructured channel regions 122 for which gate structures 112N1-112N3 and 112P1-112P3 can be referred to as "gate-all-around (GAA) structures" or "horizontal gate-all-around (HGAA) structures." NFET 102A and PFET 102B can be referred to as "GAA NFET 102A and GAA PFET 102B," respectively. The portions of gate structures 112N1-112N3 and 112P1-112P3 surrounding nanostructured channel regions 122 can be electrically isolated from adjacent epitaxial S/D regions 110N1-110N3 and 110P1-110P3 by inner spacers 124. Inner spacers 124 can include a material similar to gate spacers 114. In some embodiments, gate structures 112N1-112N3 and 112P1-112P3 can be further electrically isolated from overlying interconnect structures (not shown) by capping layers 126 and hard mask layers 128. Capping layers 126 can include oxide layers and hard mask (HM) layers 128 can include nitride layers. In some embodiments, NFET 102A and PFET 102B can be finFETs and have fin regions (not shown) instead of nanostructured channel regions 122.

Each of gate structures 112N1-112N3 and 112P1-112P3 can include a high-k gate dielectric layer 112A and a conductive layer 112B disposed on high-k gate dielectric layer 112A. Conductive layer 112B can be a multi-layered structure. The different layers of conductive layer 112B are not shown for simplicity. Conductive layer 112B can include a WFM layer disposed on high-k dielectric layer 112A, and a gate metal fill layer on the WFM layer. High-k gate dielectric layer 112A can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), $ZrO_2$, and zirconium silicate ($ZrSiO_2$). The WFM layer can include titanium aluminum (TiAl), titanium aluminum carbide (TiAlC), tantalum aluminum (TaAl), tantalum aluminum carbide (TaAlC), and a combination thereof. The gate metal fill layer can include a suitable conductive material, such as tungsten (W), titanium (Ti), silver (Ag), ruthenium (Ru), molybdenum (Mo), copper (Cu), cobalt (Co), aluminum (Al), iridium (Ir), nicket (Ni), and a combination thereof.

Epitaxial S/D regions 110N1-110N3 and 110P1-110P3 can include epitaxially-grown semiconductor materials similar to or different from each other. In some embodiments, the epitaxially-grown semiconductor material can include the same material or a different material from the material of substrate 106. Epitaxial S/D regions 110N1-110N3 can be n-type and epitaxial S/D regions 110P1-110P3 can be p-type. In some embodiments, n-type epitaxial S/D regions 110N1-110N3 can include silicon phosphide (SiP), SiAs, silicon antimony (SiSb), SiC, SiCP, or SiPAsSb. In some embodiments, p-type epitaxial S/D regions 110P1-110P3 can include SiGe, SiGeB, GeB, SiGeSnB, SiGeBGa, a III-V semiconductor compound, or a combination thereof.

Referring to FIGS. 1B-1C, NFET 102A and PFET 102B can include S/D contact structures 130 and 132 disposed on first side surfaces 110F ("front side surfaces 110F") of S/D regions 110N2-110N3 and 110P2-110P3. In some embodiments, S/D contact structures 130-132 can have structures similar to each, but S/D contact structures 130 are electrically active structures and S/D contact structures 132 are dummy structures. S/D contact structures 130 can electrically connect S/D regions 110N2 and 110P2 to a power supply (not shown) and/or other elements of semiconductor device 100 through via plugs 138 and metal lines 140 and provide electrical conduction to S/D regions 110N2 and 110P2 through front side surfaces 110F. In contrast, S/D contact structures 132 are electrically inactive structures and are electrically isolated from overlying structures by ILD layer 118B to prevent electrical conduction to S/D regions 110N3 and 110P3 through front side surfaces 110F. ILD layer 118B can be similar in material composition to ILD layer 118A, as described with reference to FIG. 1A.

In some embodiments, each of S/D contact structures 130-132 can include (i) a silicide layer 131A disposed on front side surface 110F, (ii) a metal liner 131B disposed on silicide layer 131B, and (iii) a contact plug 131C disposed on metal liner 131B. In some embodiments, silicide layers 131A can include nickel silicide (NiSi), tungsten silicide ($WSi_2$), titanium silicide ($TiSi_2$), cobalt silicide ($CoSi_2$), or a suitable metal silicide. Metal liners 131B can include a metal of silicide layers 131A. In some embodiments, contact plugs 131C can include conductive materials, such as cobalt (Co), tungsten (W), ruthenium (Ru), iridium (Ir), nickel (Ni), Osmium (Os), rhodium (Rh), aluminum (Al), molybdenum (Mo), copper (Cu), zirconium (Zr), stannum (Sn), silver (Ag), gold (Au), zinc (Zn), cadmium (Cd), and a combination thereof. Via plugs 138 and metal lines 140 can be formed by a dual damascene process and can include conductive materials, such as Ru, Co, Ni, Al, Mo, W, Ir, Os, Cu, and Pt. In some embodiments, metal lines 140 can be disposed within ESL 116B and ILD layer 118C, which are disposed on HM layers 128. ESL 116B and ILD layer 118C can be similar in material composition to respective ESL 116A and ILD layer 118A, as described with reference to FIG. 1A.

NFET 102A and PFET 102B can further include S/D contact structures 134 and 136 ("back-side S/D contact structures 134 and 136) disposed on back-side surfaces 110B of S/D regions 110N3 and 110P3, respectively. S/D contact structures 134 and 136 are formed within back-side ILD layer 142A, which is formed after the removal of fin structures 108N-108P and substrate 106 (shown in FIG. 1A) of semiconductor device 100. Back-side ILD layer 142A can be similar in material composition to ILD layer 118A, as described with reference to FIG. 1A. S/D contact structures 134 and 136 can electrically connect S/D regions 110N3 and 110P3 to a back-side power supply (not shown) and/or other elements of semiconductor device 100 through back-side via plugs 144 and back-side metal lines 146 and provide electrical conduction to S/D regions 110N3 and 110P3 through back-side surfaces 110B. The arrangement of S/D contact structures 130 and 134 in NFET 102A provides a conduction path between the front and back sides of semiconductor device 100 through S/D regions 110N2-110N3 and through the stack of nanostructured channel regions 122 interposed between S/D regions 110N2-110N3. Similarly, S/D contact structures 130 and 136 in PFET 102B provides a conduction path between the front and back sides of semiconductor device 100 through S/D regions 110P2-110P3 and through the stack of nanostructured channel regions 122 interposed between S/D regions 110P2-110P3.

In some embodiments, S/D contact structure 136 can include (i) a pWFM silicide layer 149 disposed on back-side surface 110B, (ii) a pWFM layer 152 disposed on pWFM silicide layer 149, and (iii) a contact plug 154 disposed on pWFM layer 152. In some embodiments, pWFM silicide layer 149 can include a metal silicide with a work function value closer to a valence band-edge energy than a conduction band-edge energy of the material of S/D region 110P3. The metal silicide in pWFM silicide layer 149 can include nickel silicide (NiSi), cobalt silicide (CoSi), manganese silicide (MnSi), tungsten silicide (WSi), iron silicide (FeSi), rhodium silicide (RhSi), palladium silicide (PdSi), ruthenium silicide (RuSi), platinum silicide (PtSi), iridium silicide (IrSi), osmium silicide (OsSi), or a combination thereof. In some embodiments, pWFM layer 152 can include a metal of pWFM silicide layer 149 and contact plug 154 can include conductive materials, such as Co, W, Ru, Ir, Zr, Sn, Ag, Cu, Au, Al, Ca, Be, Mg, Rh, Na, Ir, W, Mo, Zn, Ni, K, Co, Cd, Ru, In, Os, Si, Ge, Mn, and a combination thereof.

In some embodiments, S/D contact structure 134 can include (i) an nWFM silicide layer 148 disposed on back-side surface 110B, (ii) a dual metal liner including an nWFM layer 150 disposed on silicide layer 148 and pWFM layer 152 disposed on nWFM layer 150, and (iii) contact plug 154 disposed on pWFM layer 152. In some embodiments, S/D contact structure 134 can further include a metal alloy layer 153 at the interface between nWFM and pWFM layers 150-152. Metal alloy layer 153 can be formed from the diffusion and mixing of metals of nWFM and pWFM layers 150-152 at the interface. In some embodiments, nWFM silicide layer 148 can include a metal silicide with a work function value closer to a conduction band-edge energy than a valence band-edge energy of the material of S/D region 110N3. The metal silicide in nWFM silicide layer 148 can include titanium silicide (TiSi), tantalum silicide (TaSi), molybdenum (MoSi), zirconium silicide (ZrSi), hafnium silicide (HfSi), scandium silicide (ScSi), yttrium silicide (YSi), holmium silicide (HoSi), terbium silicide (TbSi), gadolinium silicide (GdSi), lutetium silicide (LuSi), dysprosium silicide (DySi), erbium silicide (ErSi), ybtterbium silicide (YbSi), or a combination thereof. In some embodiments, The thickness of nWFM and pWFM silicide layers 148-149 can range from about 1 nm to about 10 nm. Below this range of thickness, nWFM and pWFM silicide layers 148-149 may not adequately reduce contact resistance to provide a highly conductive interface between S/D region 110N3 and S/D contact structure 134 and between S/D region 110P3 and S/D contact structure 136. On the other hand, if the thickness is greater than 10 nm, the processing time (e.g., silicidation reaction time) for the formation of nWFM and pWFM silicide layers 148-149 increases, and consequently increases device manufacturing cost.

In some embodiments, regions 111N-111P of respective S/D regions 110N2-110P3 adjacent to respective S/D contact structures 134-136 can have a higher dopant concentration than other regions of S/D regions 110N2-110P3. The dopant concentrations of regions 111N-111P can range from about $5\times10^{19}$ atoms/cm$^3$ to about $5\times10^{21}$ atoms/cm$^3$. Such high dopant concentrations in regions 111N-111P further reduce contact resistance between S/D region 110N3 and S/D contact structure 134 and between S/D region 110P3 and S/D contact structure 136. For effective reduction of contact resistance, these regions 111N-111P can have a vertical dimension along a Z-axis ranging from about 1 nm to about 5 nm.

NFET 102A and PFET 102B can further include back-side HM layers 156 and back-side spacers 158. Back-side HM layers 156 can include nitride layers and can electrically isolate S/D contact structures 134 and 136 from gate structures 112N2-112N3 and 112P2-112P3. Back-side spacers 158 prevent diffusion of conductive materials from S/D contact structures 134 and 136 to adjacent elements through back-side ILD layer 142A. In some embodiments, back-side spacers 158 can include an insulating material, such as SiN, SiCN, SiOCN, $SiO_2$, and a high-k dielectric material. The thickness of back-side spacers 158 can range from about 2 nm to about 6 nm. Below this range of thickness, back-side spacers 158 may not adequately prevent diffusion of conductive materials from S/D contact structures 134 and 136 to adjacent elements through back-side ILD layer 142A. On the other hand, if the thickness is greater than 6 nm, the processing time (e.g., deposition time, etching time) for the formation of back-side spacers 158 increases, and consequently increases device manufacturing cost.

In some embodiments, back-side surfaces 110B of S/D regions 110N2-110P2 are vertically displaced from back-side HM layers 156 by a distance equal to about the thickness of inner spacers 124. Such vertical displacement prevents or reduces parasitic capacitance between S/D region 110N2 and S/D contact structure 134 and between S/D region 110P2 and S/D contact structure 136.

In some embodiments, back-side via plugs 144 and back-side metal lines 146 can be formed by a dual damascene process and can include conductive materials, such as Ru, Co, Ni, Al, Mo, W, Ir, Os, Cu, and Pt. In some embodiments, back-side metal lines 146 can be disposed within back-side ESL 160 and back-side ILD layer 142B, which are disposed on back-side ILD layers 142A. ESL 160 and back-side ILD layer 142B can be similar in material composition to respective ESL 116A and ILD layer 118A described with reference to FIG. 1A.

Figure 2:
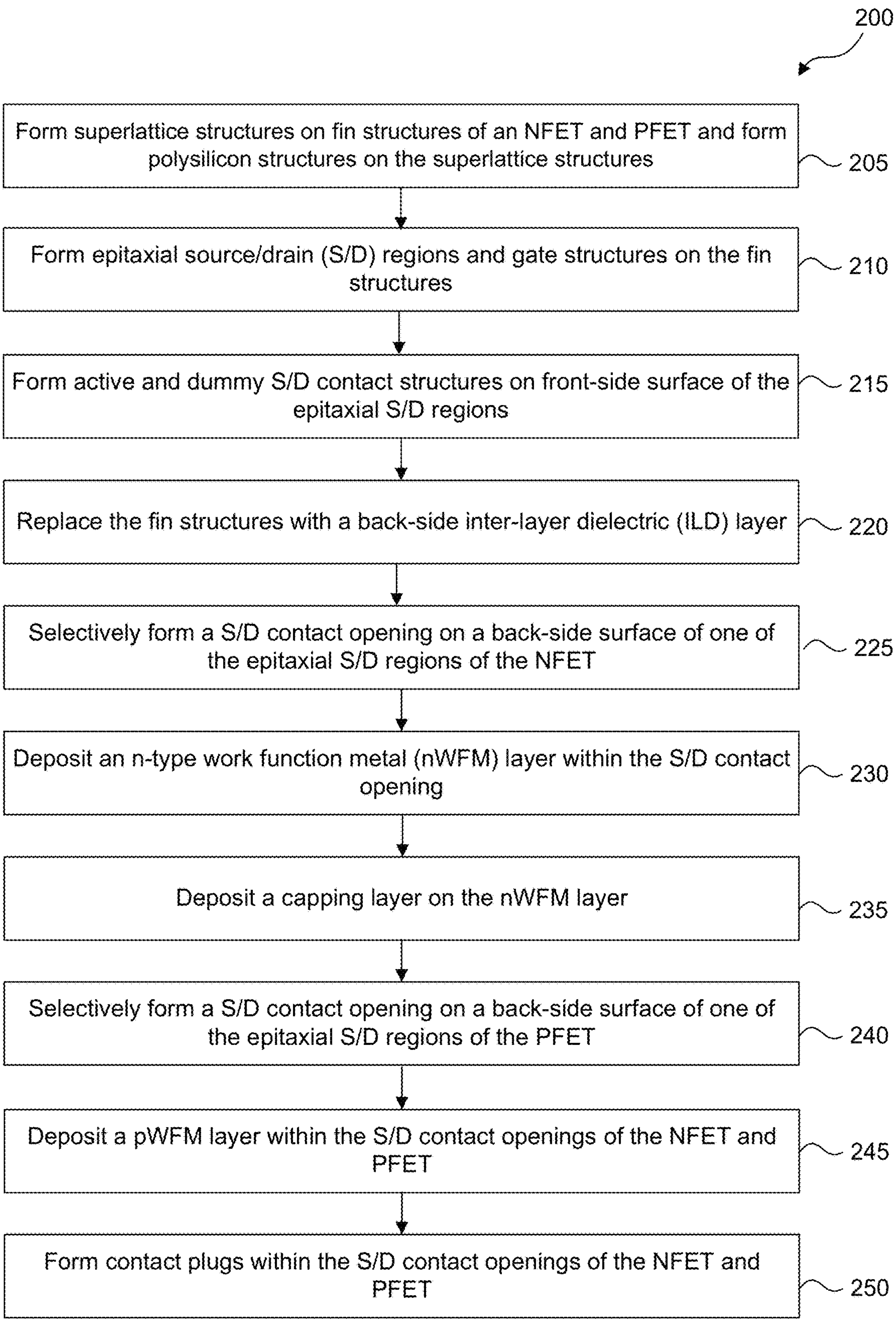
FIG. 2 is a flow diagram of a method for fabricating a semiconductor device with dual side contact structures, in accordance with some embodiments.

FIG. 2 is a flow diagram of an example method 200 for fabricating NFET 102A and PFET 102B of semiconductor device 100, according to some embodiments. For illustrative purposes, the operations illustrated in FIG. 2 will be described with reference to the example fabrication process for fabricating NFET 102A and PFET 102B as illustrated in FIGS. 3A-26B. FIGS. 3A-26B are cross-sectional views of NFET 102A and PFET 102B at various stages of fabrication, according to some embodiments. Operations can be performed in a different order or not performed depending on specific applications. It should be noted that method 200 may not produce a complete NFET 102A and PFET 102B. Accordingly, it is understood that additional processes can be provided before, during, and after method 200, and that some other processes may only be briefly described herein. Elements in FIGS. 3A-26B with the same annotations as elements in FIGS. 1A-1C are described above.

Figure 3B:
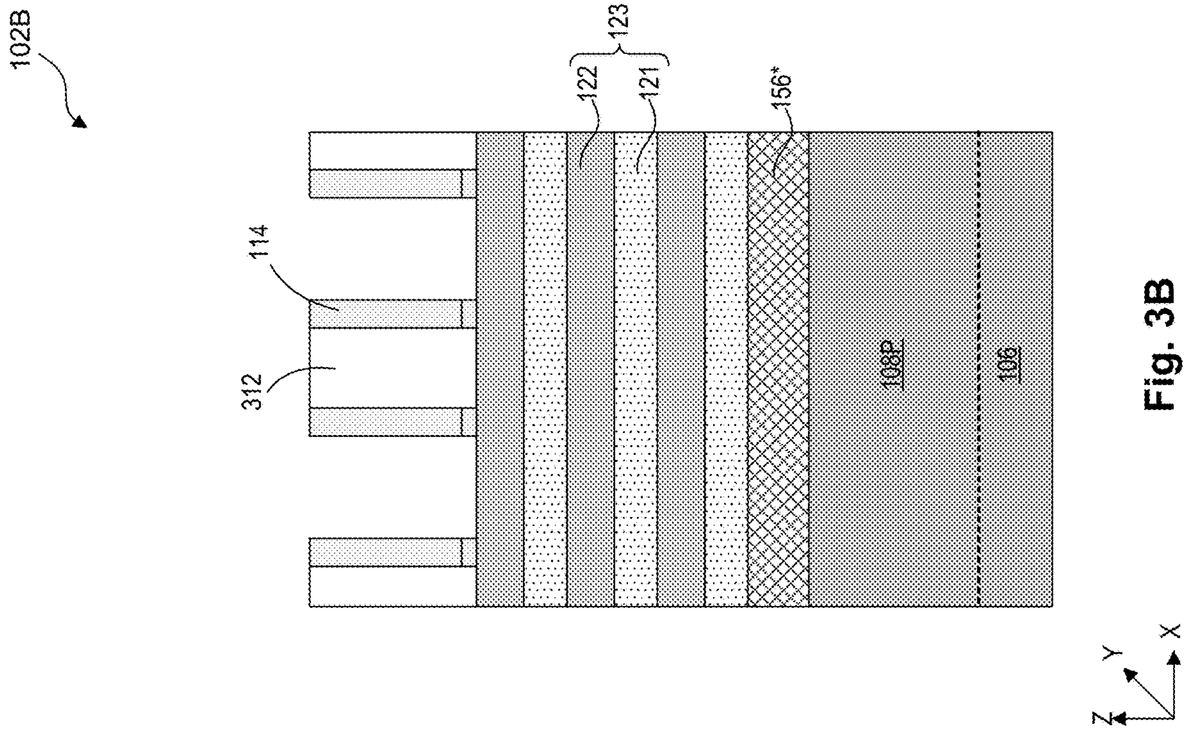
FIGS. 3A, 3B, 4A, 4B, 5A, 5B, 6A, 6B, 7A, 7B, 8A, 8B, 9A, 9B, 10A. 10B, 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 24A, 24B, 25A, 25B, 26A, and 26B illustrate cross-sectional views of a semiconductor device with dual side contact structures at various stages of its fabrication process, in accordance with some embodiments.
Figure 3A:
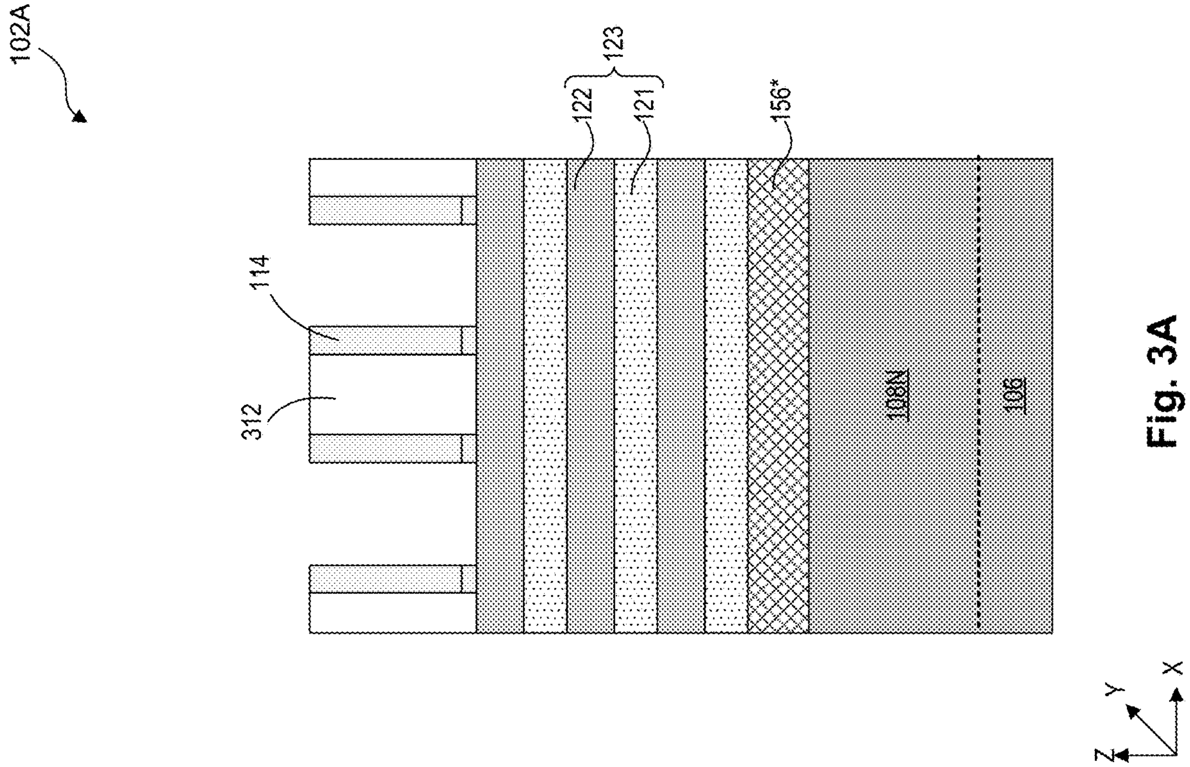

In operation 205, superlattice structures are formed on fin structures of an NFET and PFET, and polysilicon structures are formed on the superlattice structures. For example, as shown in FIGS. 3A-3B, polysilicon structures 312 are formed on superlattice structures 123, which are formed on fin structures 108N-108P. Superlattice structures 123 can include nanostructured layers 121-122 arranged in an alternating configuration. In some embodiments, nanostructured layers 121 can include SiGe and nanostructured layers 122 can include Si without any substantial amount of Ge (e.g., with no Ge). During subsequent processing, polysilicon structures 312 and nanostructured layers 121 can be replaced in a gate replacement process to form gate structures 112N1-112N3 and 112P1-112P3. In some embodiments, SiGe layers 156* can be epitaxially formed on fin structures 108N-108P, and superlattice structures 123 can be epitaxially formed on SiGe layer 156*. The Ge concentration in SiGe layer 156* can be about 1 order or about 2 orders of magnitude greater than the Ge concentration in nanostructured layers 121. During subsequent processing, SiGe layer 156* can form back-side HM layers 156.

Figure 4B:
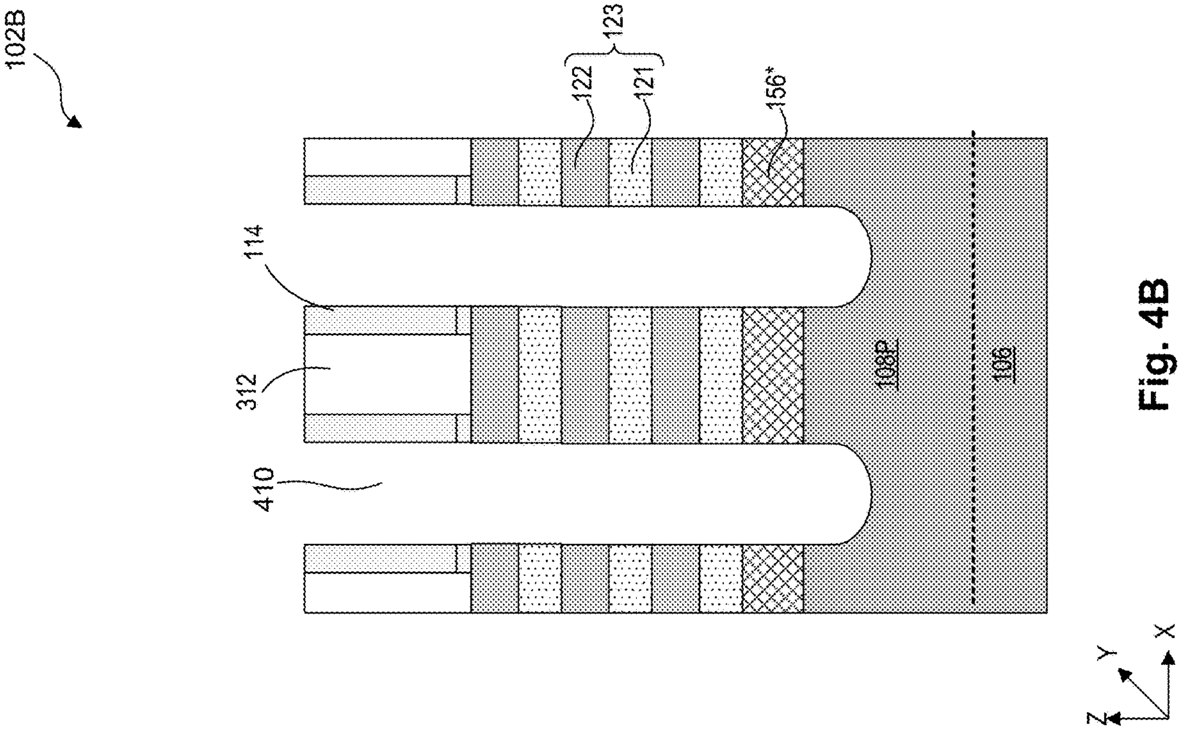
Figure 4A:
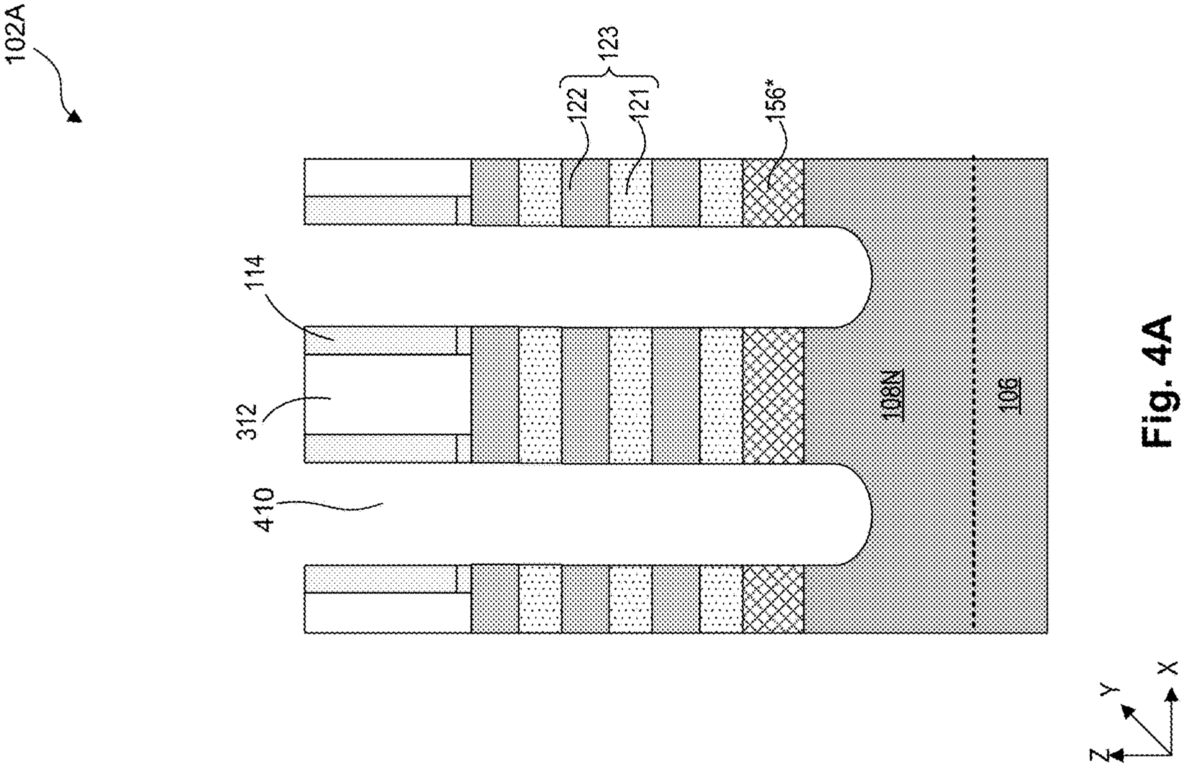
Figure 7B:
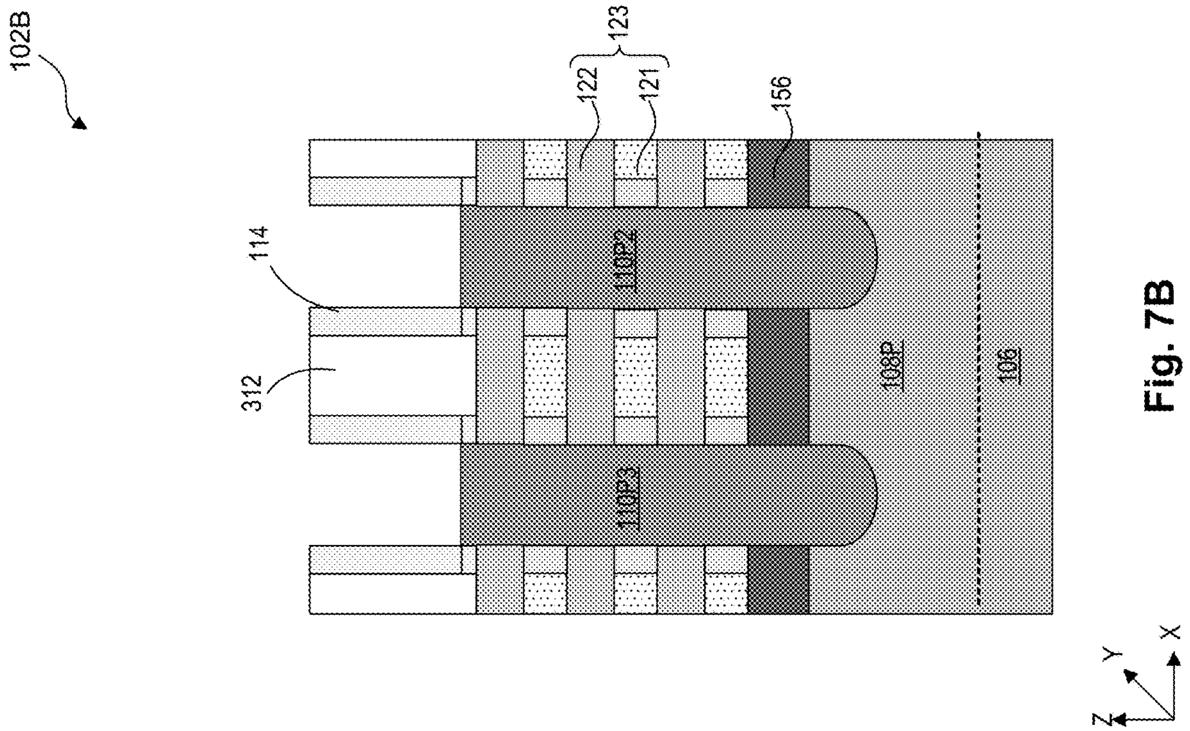
Figure 7A:
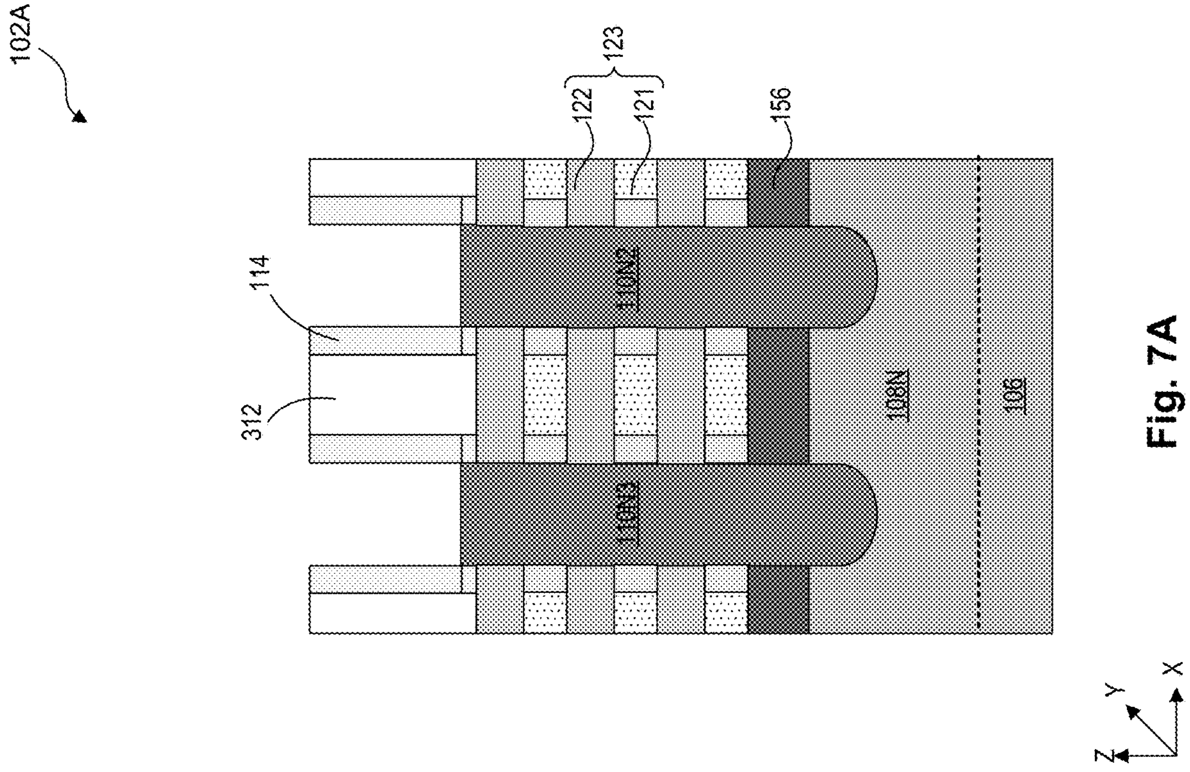
Figure 10A:
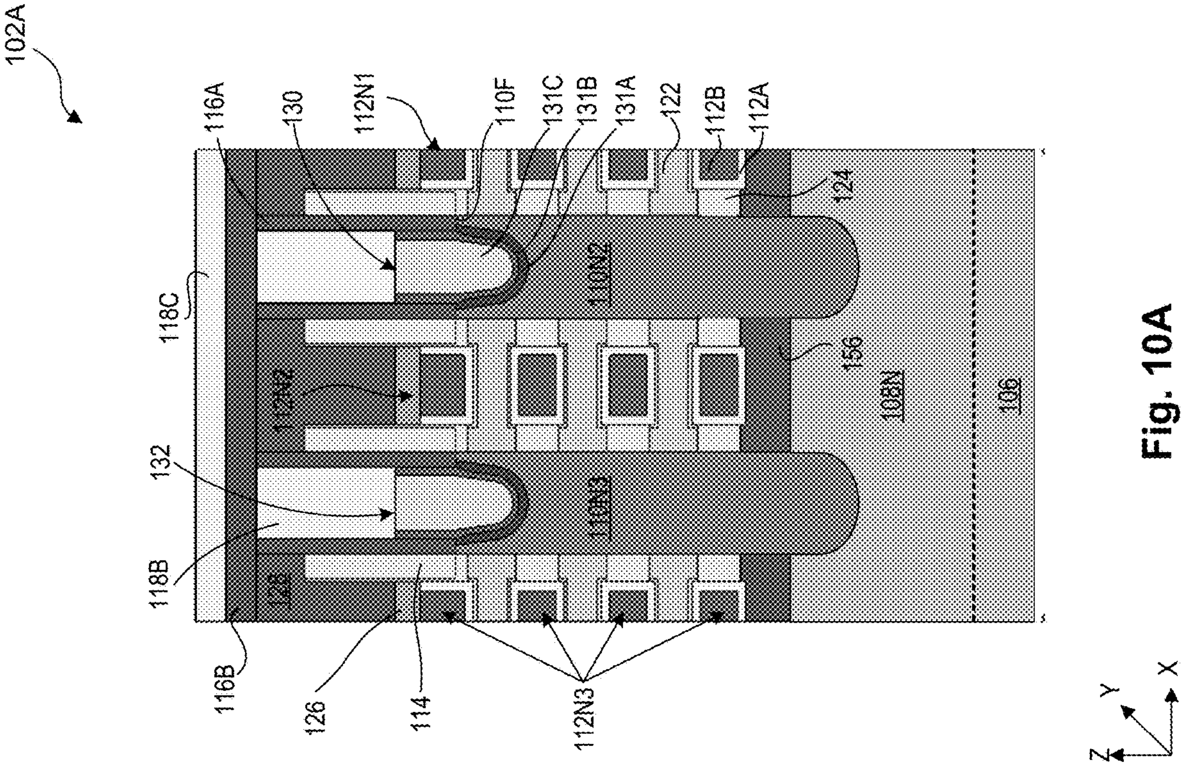
Figure 10B:
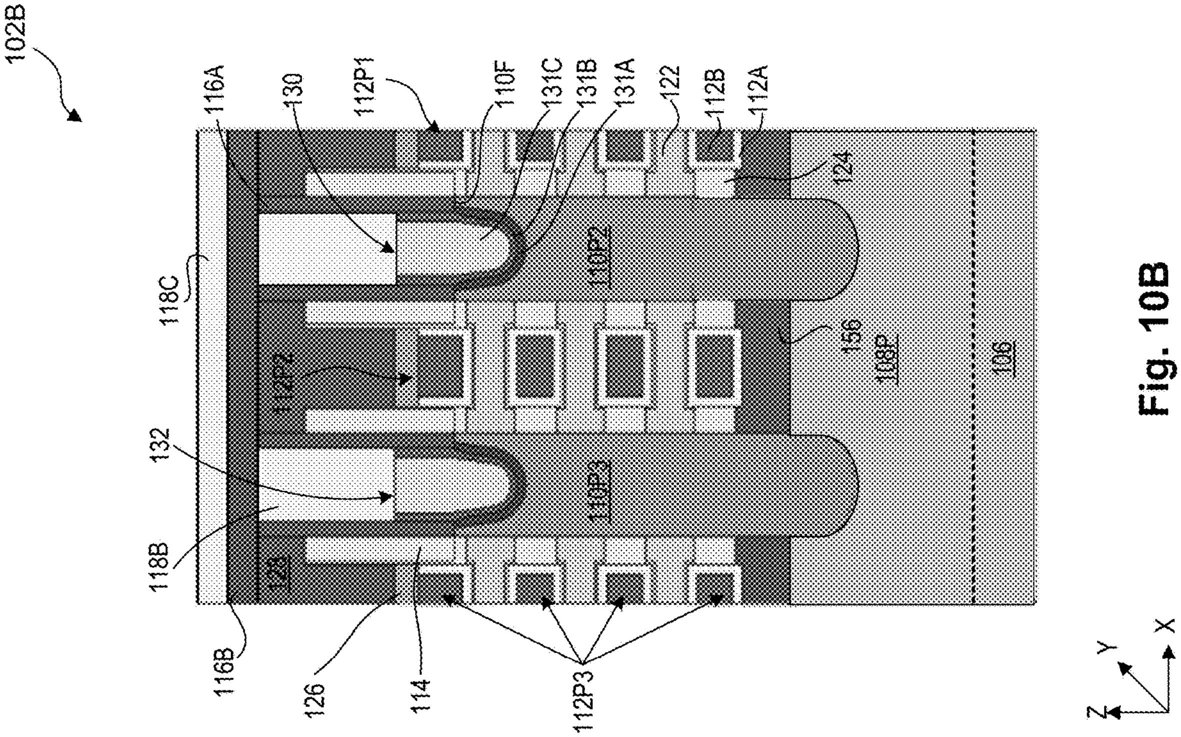

Referring to FIG. 2, in operation 210, epitaxial S/D regions and gate structures are formed on the fin structures. For example, epitaxial S/D regions 110N2-110N3 and 110P2-110P3 are formed on respective fin structures 108N and 108P, as shown in FIGS. 7A-7B, and gate structures 112N1-11N3 and 112P1-112P3 are formed on respective fin structures 108N and 108P, as shown in FIGS. 10A-10B. The formation of epitaxial S/D regions 110N2-110N3 and 110P2-110P3 can include sequential operations of (i) forming S/D openings 410, through superlattice structures 123, on portions of fin structures 108N-108P that are not underlying polysilicon structures 312, as shown in FIGS. 4A-4B, (ii) epitaxially growing n-type and p-type semiconductor materials within S/D openings 410, as shown in FIGS. 7A-7B.

Figure 5B:
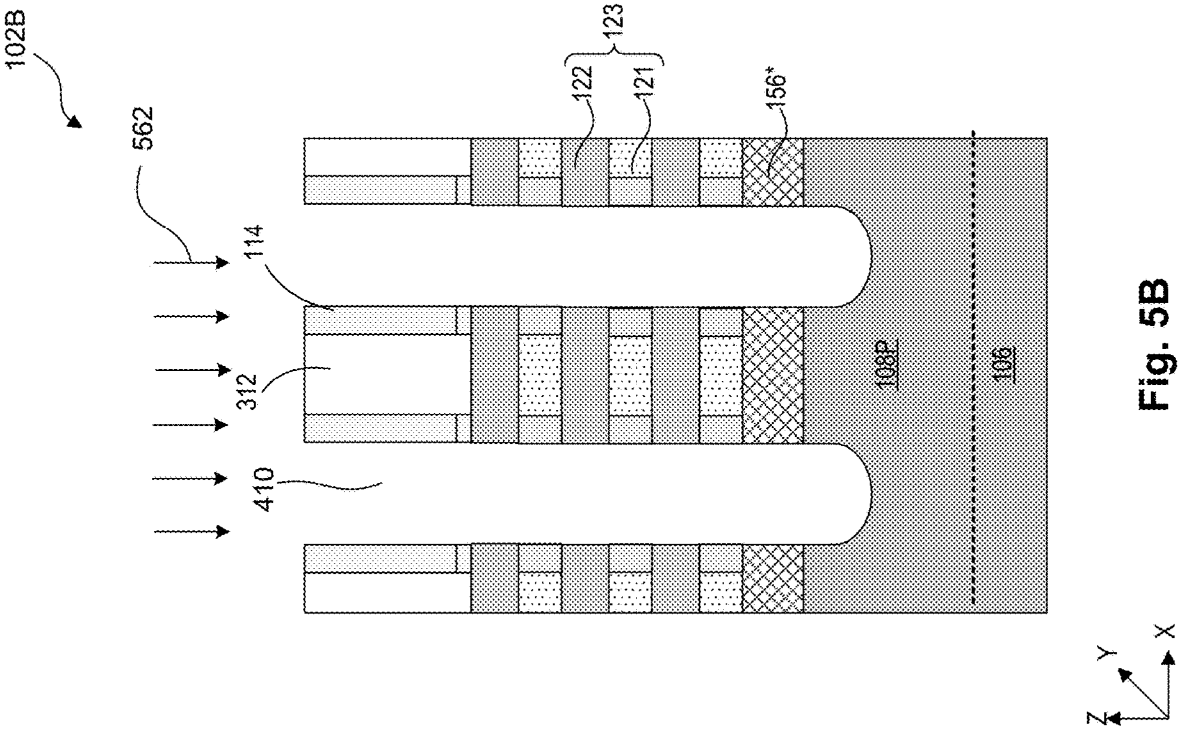
Figure 5A:
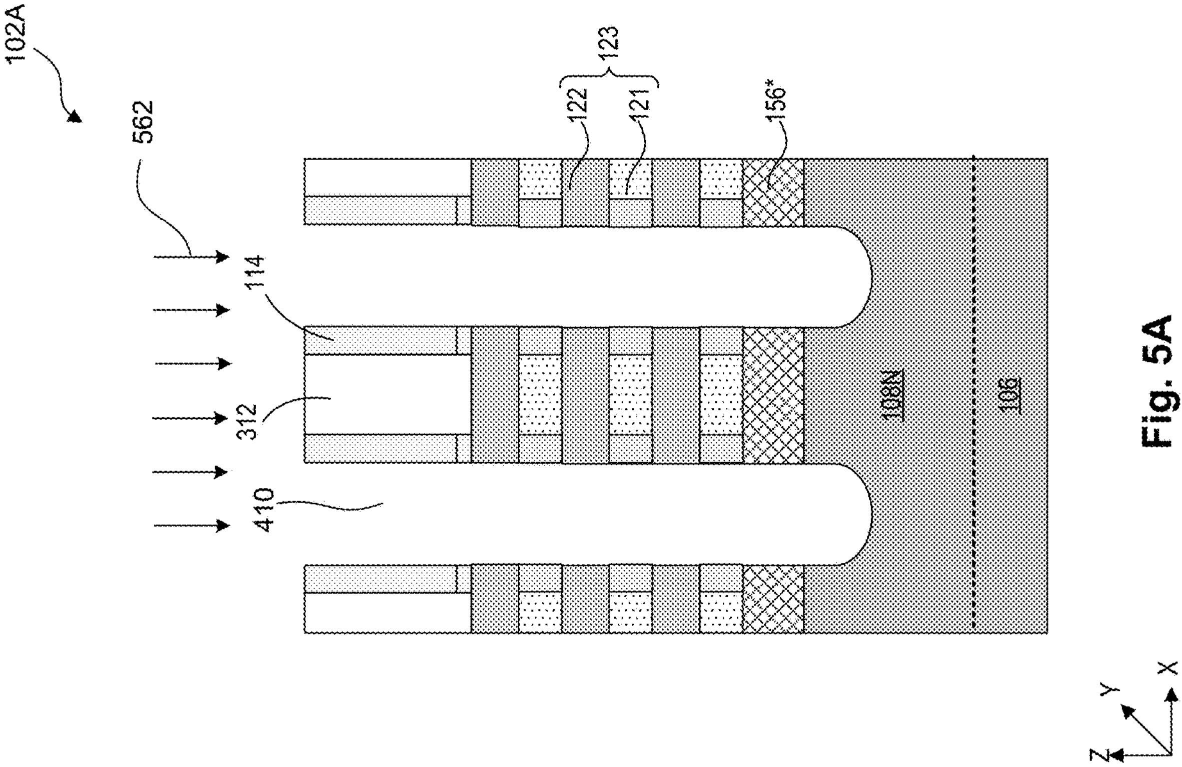
Figure 6B:
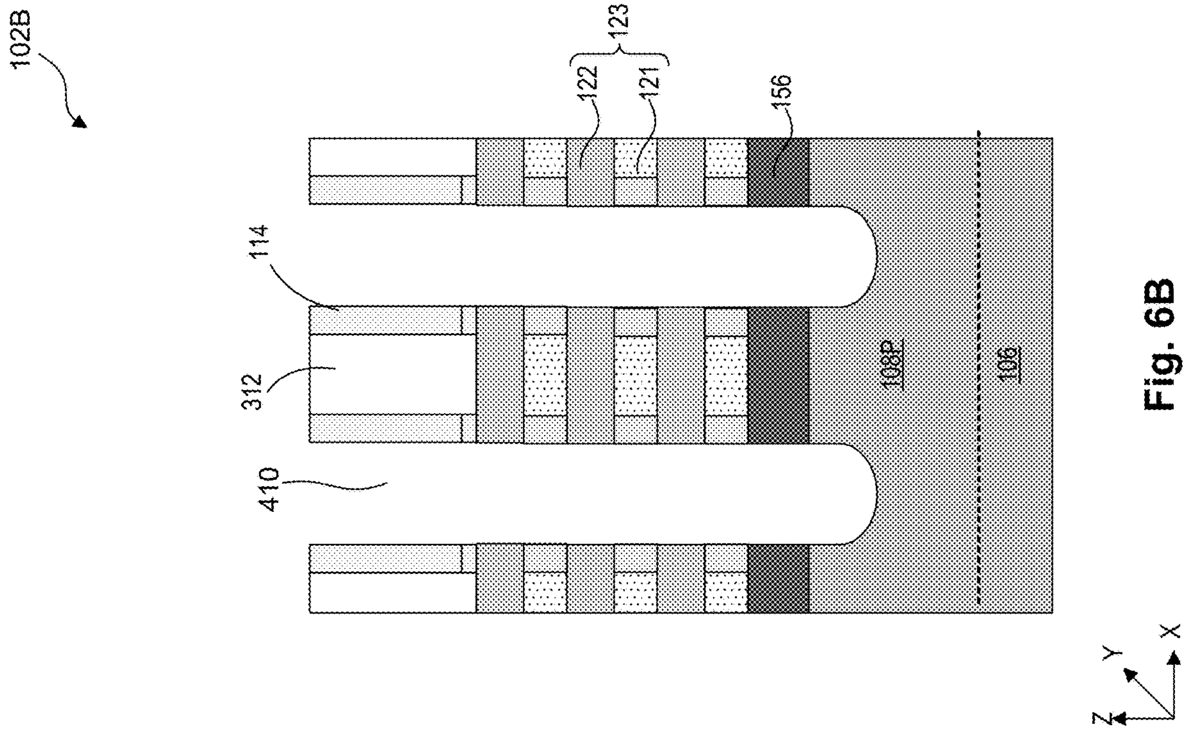
Figure 6A:
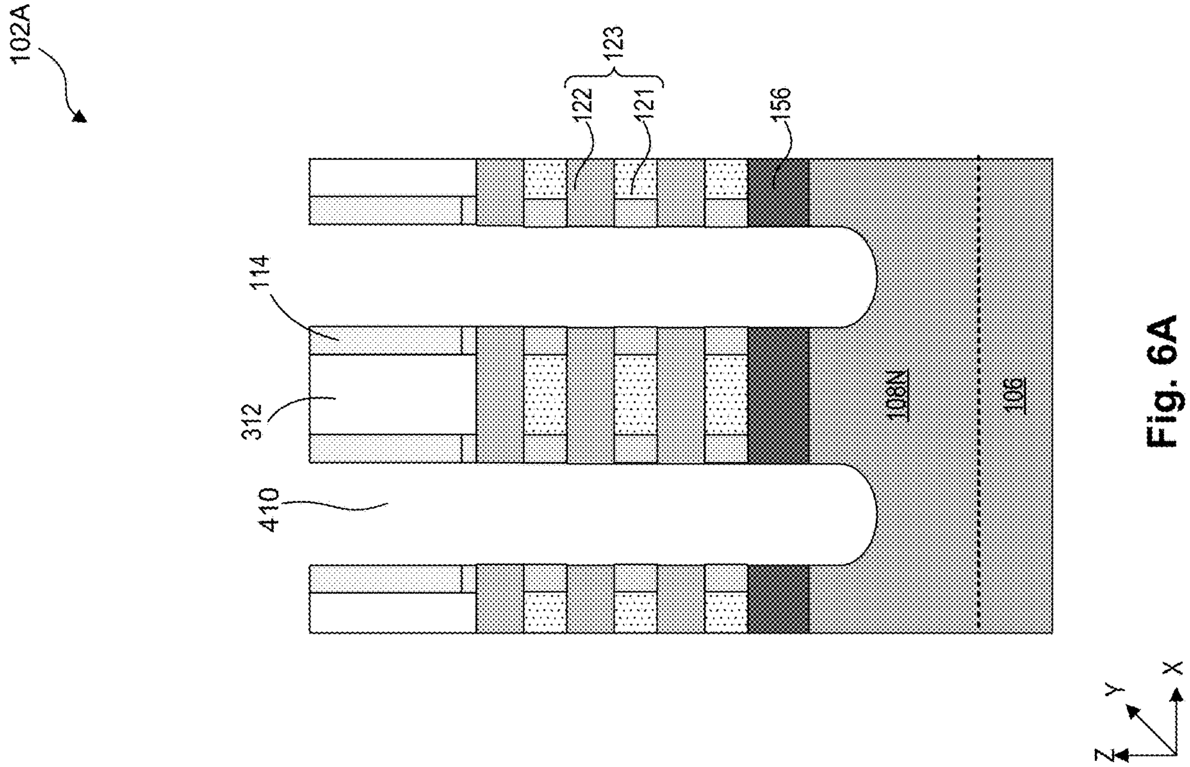

In some embodiments, inner spacers 124 and back-side HM layers 156 can be formed between operations (i) and (ii) of the formation process of epitaxial S/D regions 110N2-110N3 and 110P2-110P3, as shown in FIGS. 5A-6B. Inner spacers 124 can be formed after the formation of S/D openings 410, as shown in FIGS. 5A-5B, and back-side HM layers 156 can be formed after the formation of inner spacers 124, as shown in FIGS. 6A-6B. The formation of back-side HM layers 156 can include flowing a nitrogen precursor gas 562 (e.g., $N_2$, $NH_3$, etc.) on the structures of FIGS. 5A-5B, which reacts with SiGe layer 156* to form back-side HM layers 156, as shown in FIGS. 6A-6B. Inner spacers 124 protect nanostructured layers 121 from reacting with nitrogen precursor gas 562.

Figure 8B:
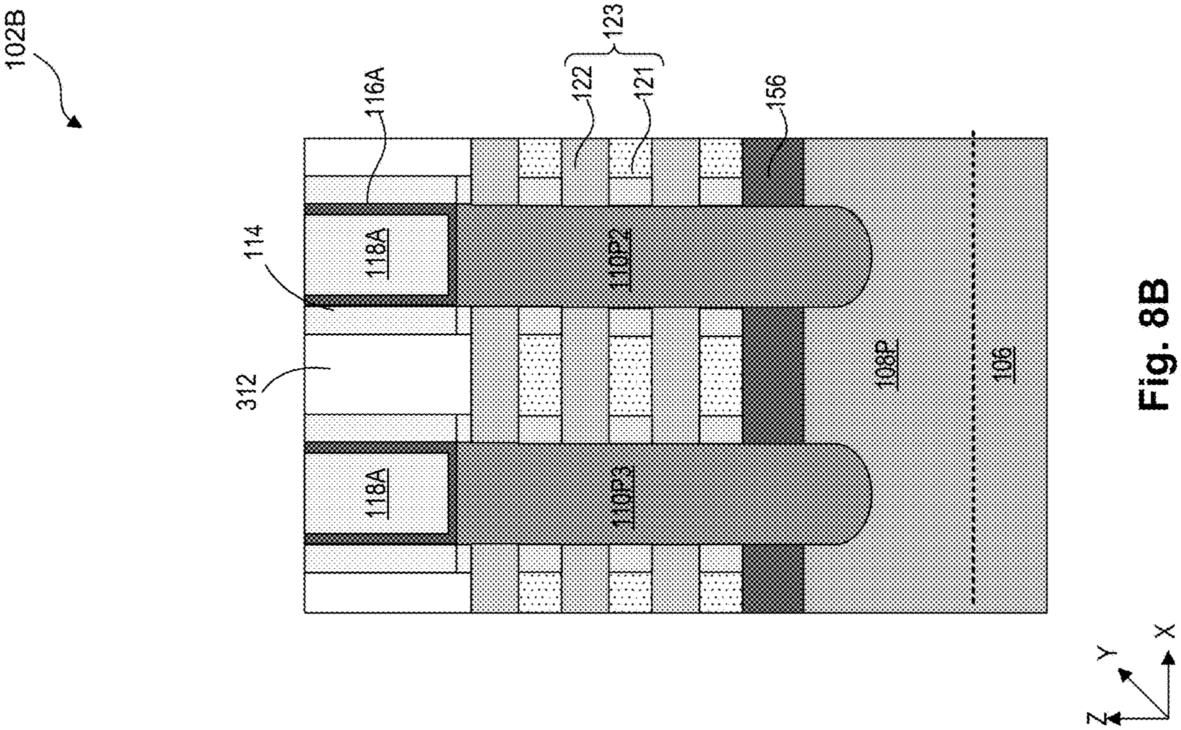
Figure 8A:
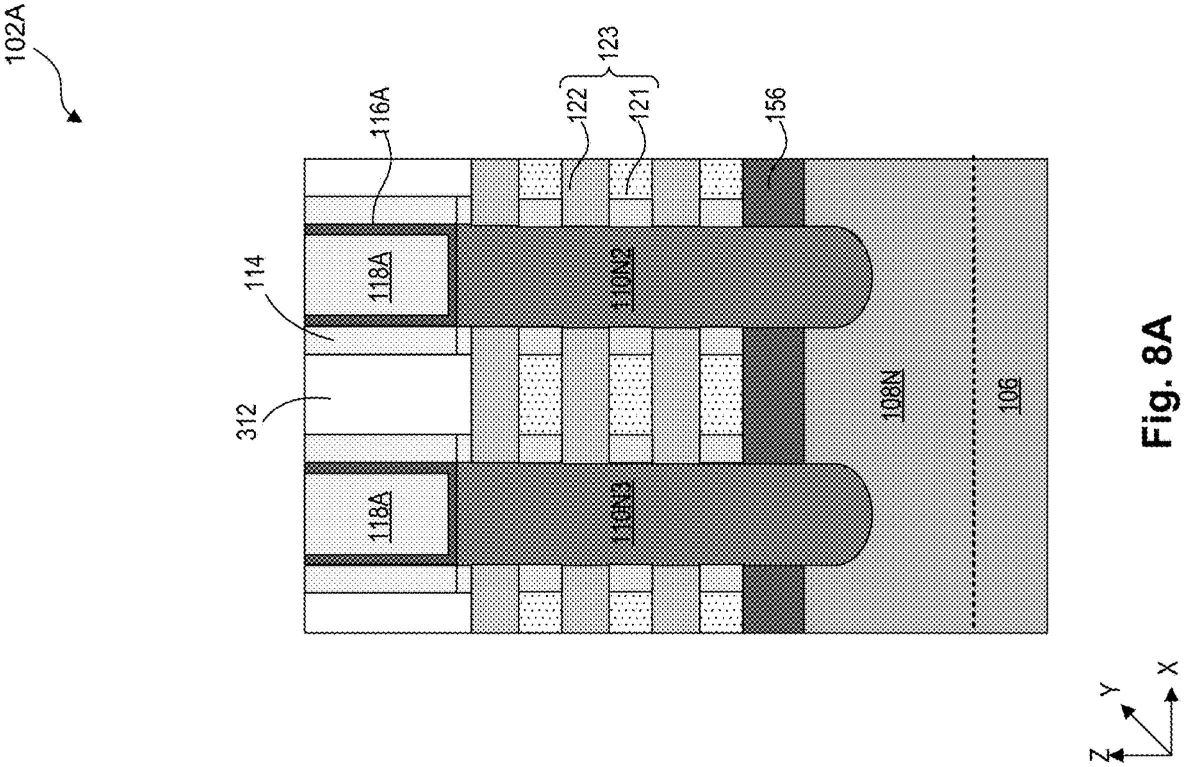
Figure 9B:
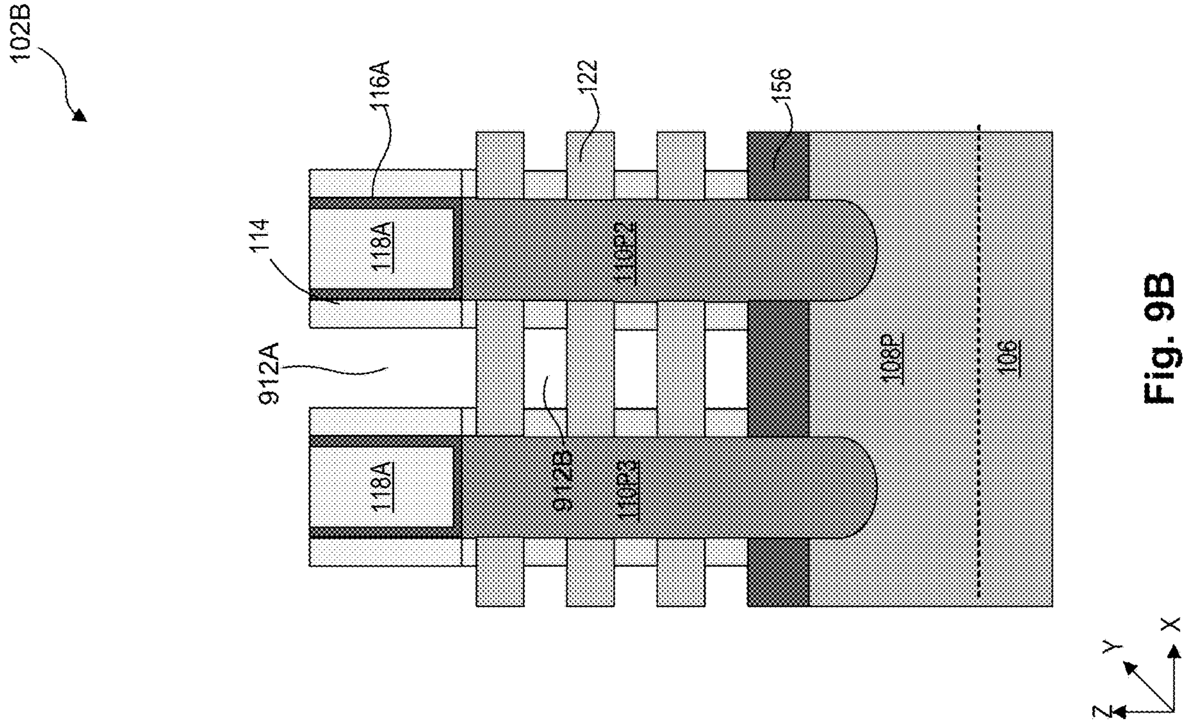
Figure 9A:
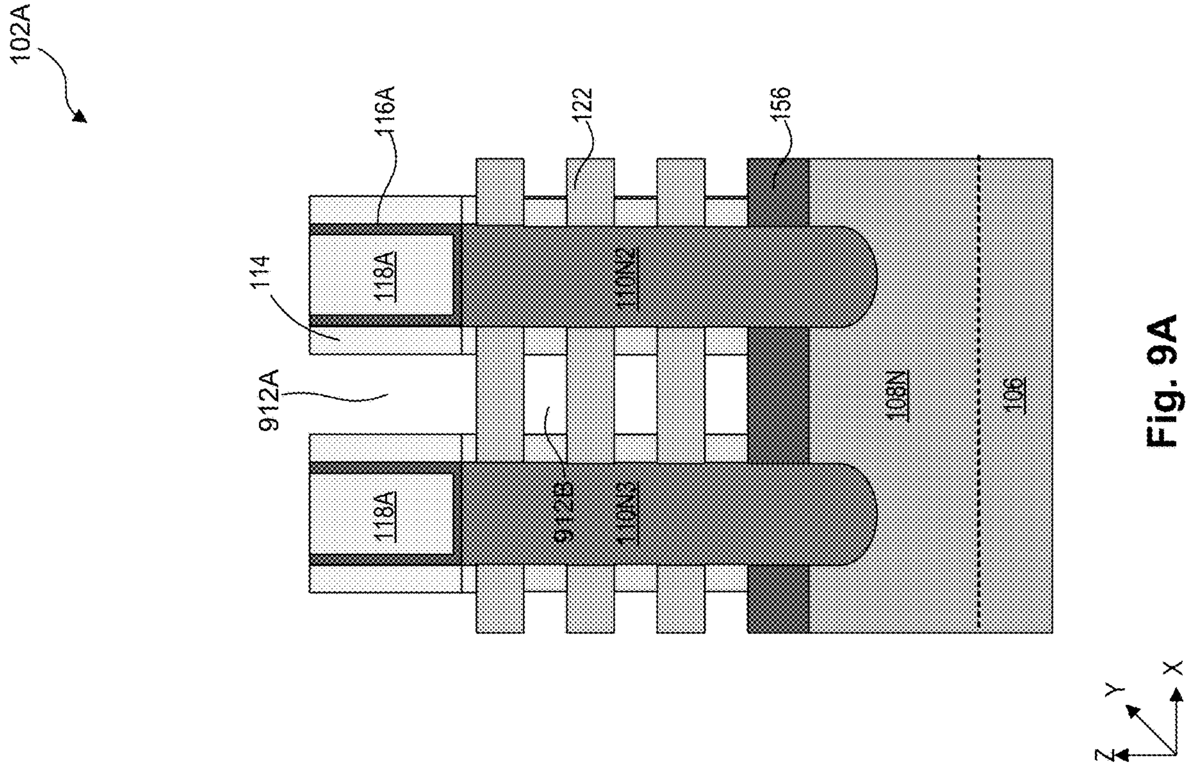

After the formation of epitaxial S/D regions 110N2-110N3 and 110P2-110P3, ESL 116A and ILD layer 118A can be formed on epitaxial S/D regions 110N2-110N3 and 110P2-110P3 to form the structures of FIGS. 8A-8B. Following the formation of ILD layer 118A, gate structures 112N1-11N3 and 112P1-112P3 can be formed, which can include sequential operations of (i) etching polysilicon structures 312 to form gate openings 912A, as shown in FIGS. 9A-9B, (ii) etching nanostructured layers 121 through gate openings 912A to form gate openings 912B, as shown in FIGS. 9A-9B, and (iii) depositing high-k gate dielectric layers 112A and conductive layers 112B within gate openings 912A-912B, as shown in FIGS. 10A-10B. In some embodiments, the gate formation process can be followed by the formation of capping layers 126 and hard mask layers 128 on gate structures 112N1-11N3 and 112P1-112P3, as shown in FIGS. 10A-10B.

Figure 11B:
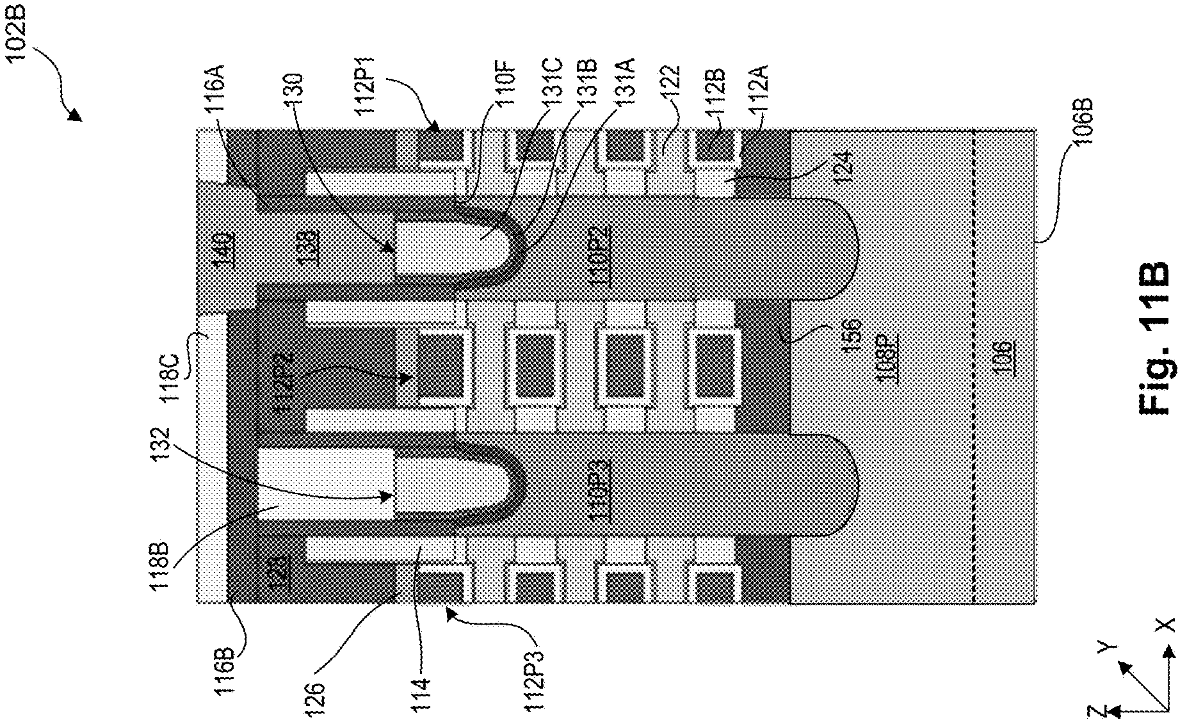
Figure 11A:
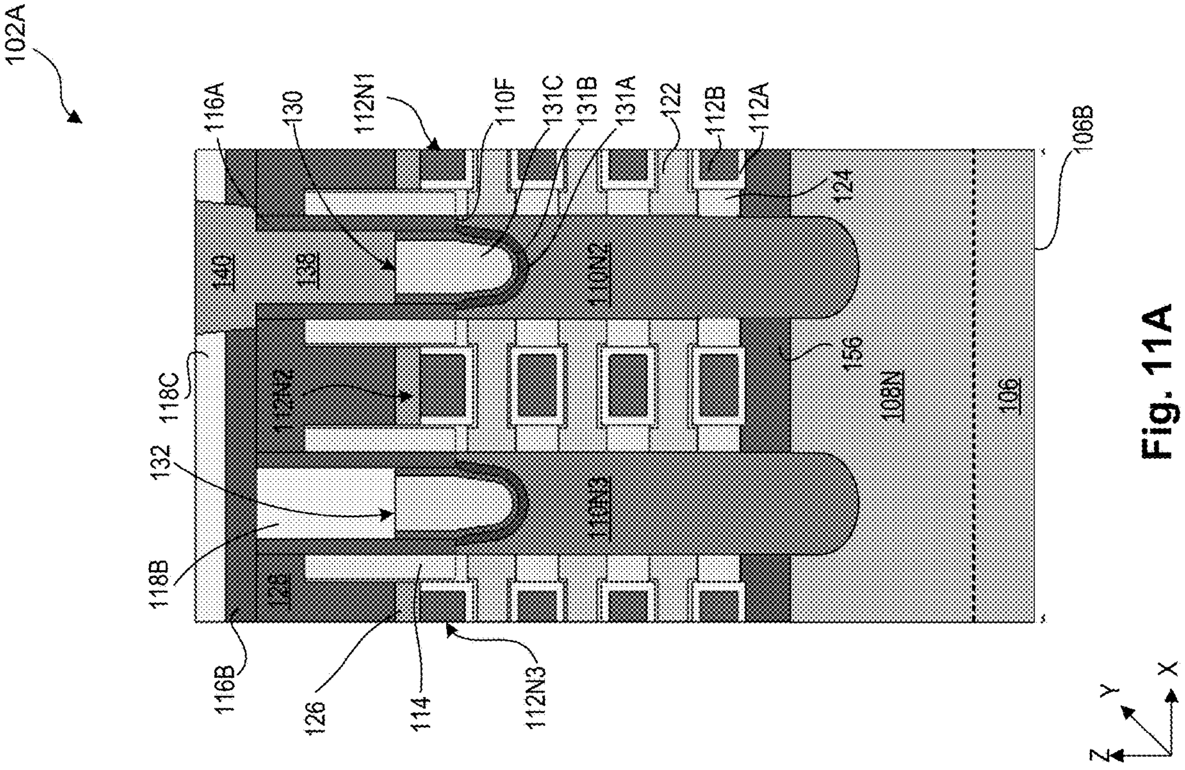

Referring to FIG. 2, in operation 215, active and dummy S/D contact structures are formed on front-side surfaces of the epitaxial S/D regions. For example, as described with respect to FIGS. 10A-11B, active S/D contact structures 130 are formed on front-side surfaces 110F of S/D regions 110N2-110P2 and dummy S/D contact structures 132 are formed on front-side surfaces 110F of S/D regions 110N3-110P3. S/D contact structures 130-132 can be formed through ILD layers 118A (shown in FIGS. 9A-9B) on front-side surfaces 110F, followed by the deposition of ILD layer 118B, ESL 116B, and ILD layer 118C, as shown in FIGS. 10A-10B. After the deposition of ILD layer 118C, via plugs 138 and metal lines 140 can be formed through ILD layer 118B, ESL 116B, and ILD layer 118C on S/D contact structures 130 in a dual damascene process, as shown in FIGS. 11A-11B.

Referring to FIG. 2, operations 220-250 described below with reference to FIGS. 12A-25B can form back-side S/D contact structures 134 and 136 of NFET 102A and PFET 102B.

Figure 12A:
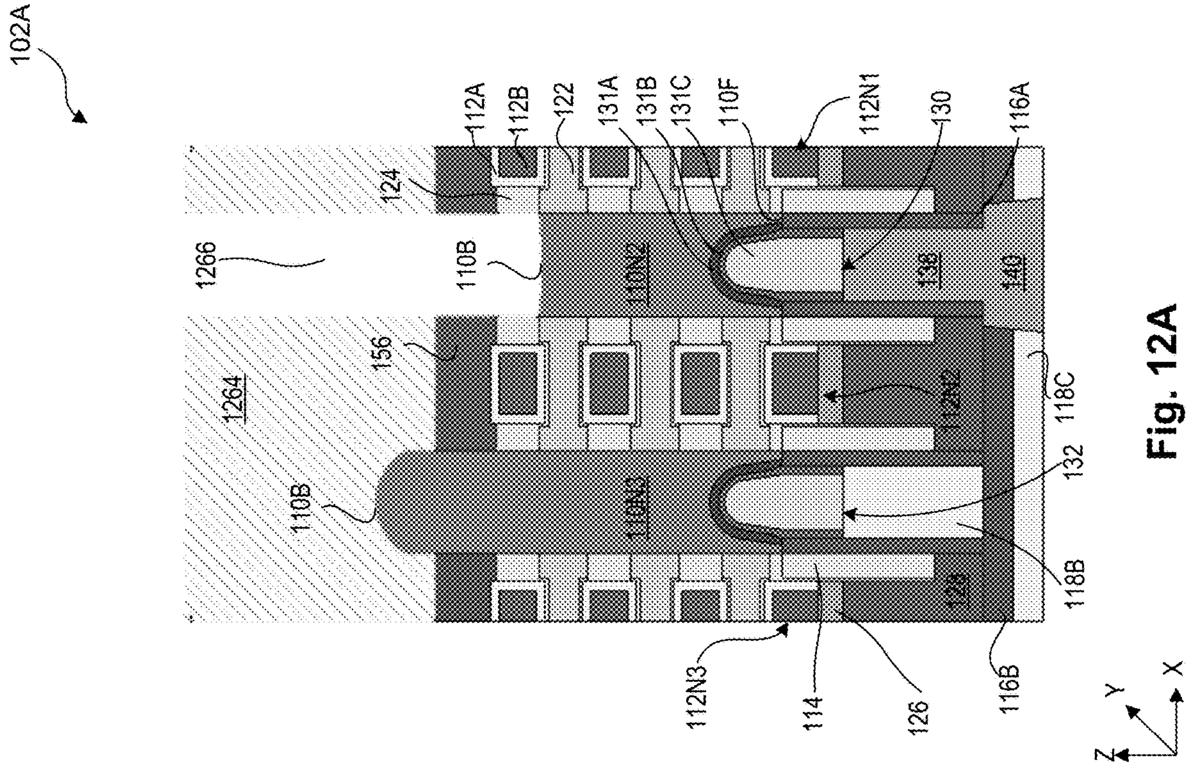
Figure 12B:
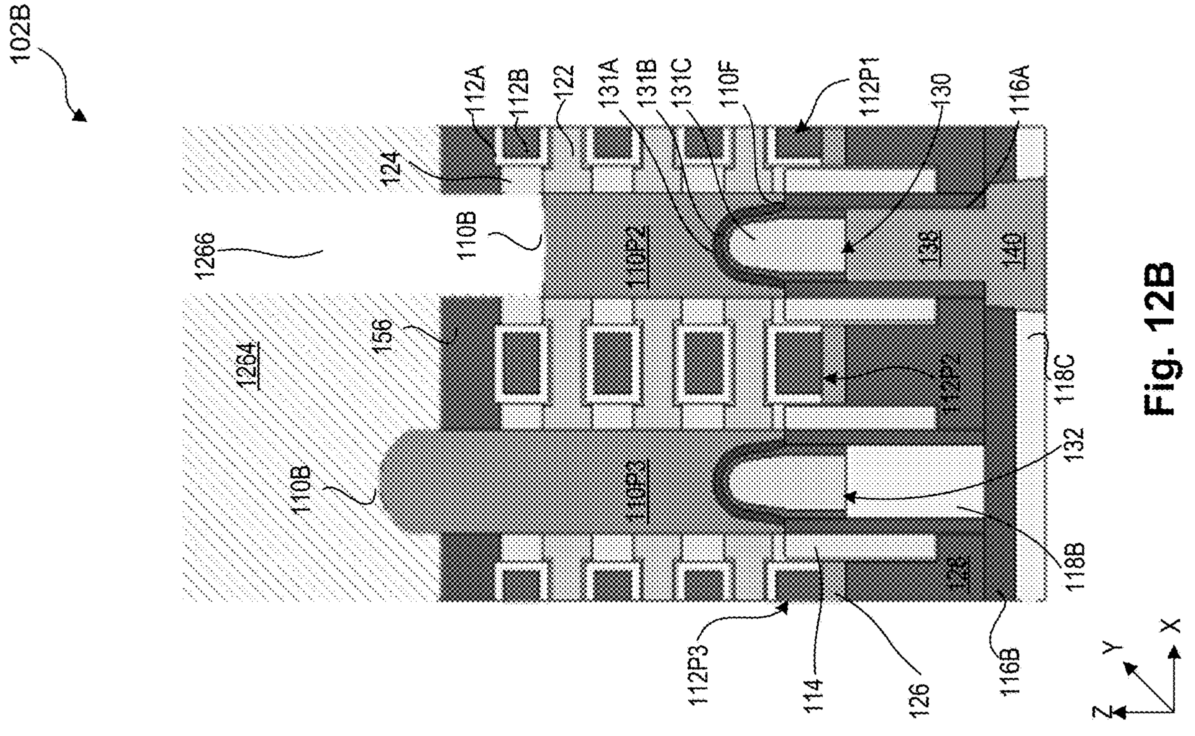
Figure 13B:
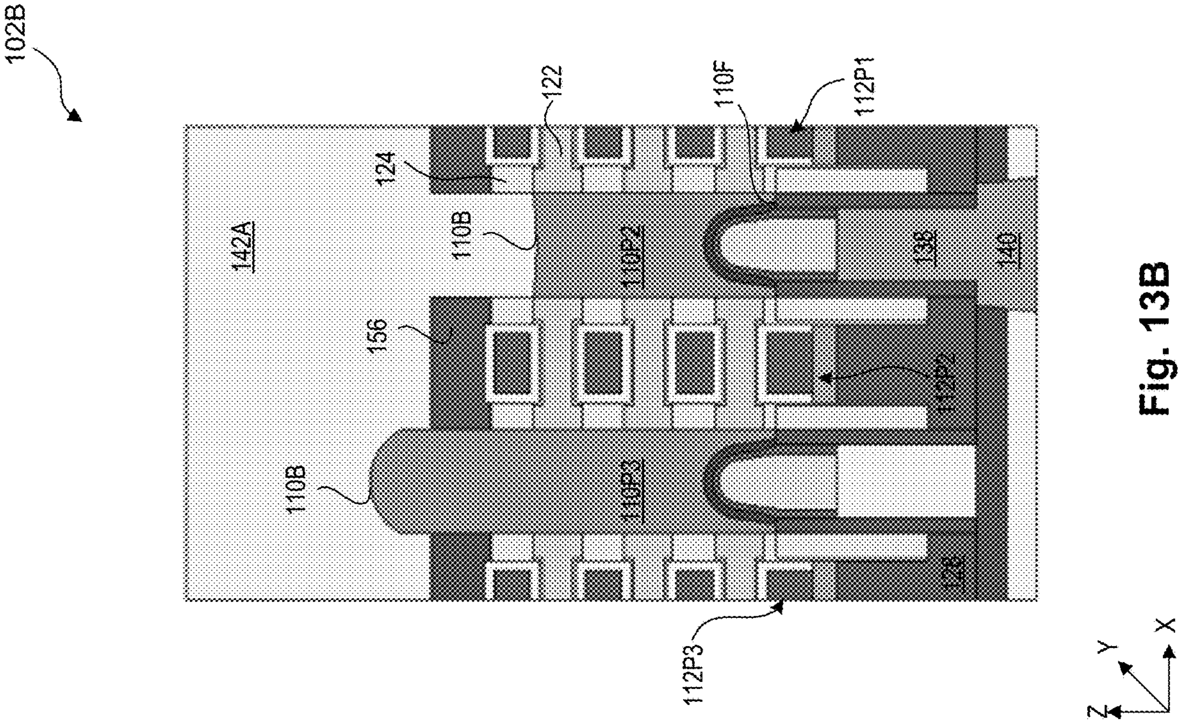
Figure 13A:
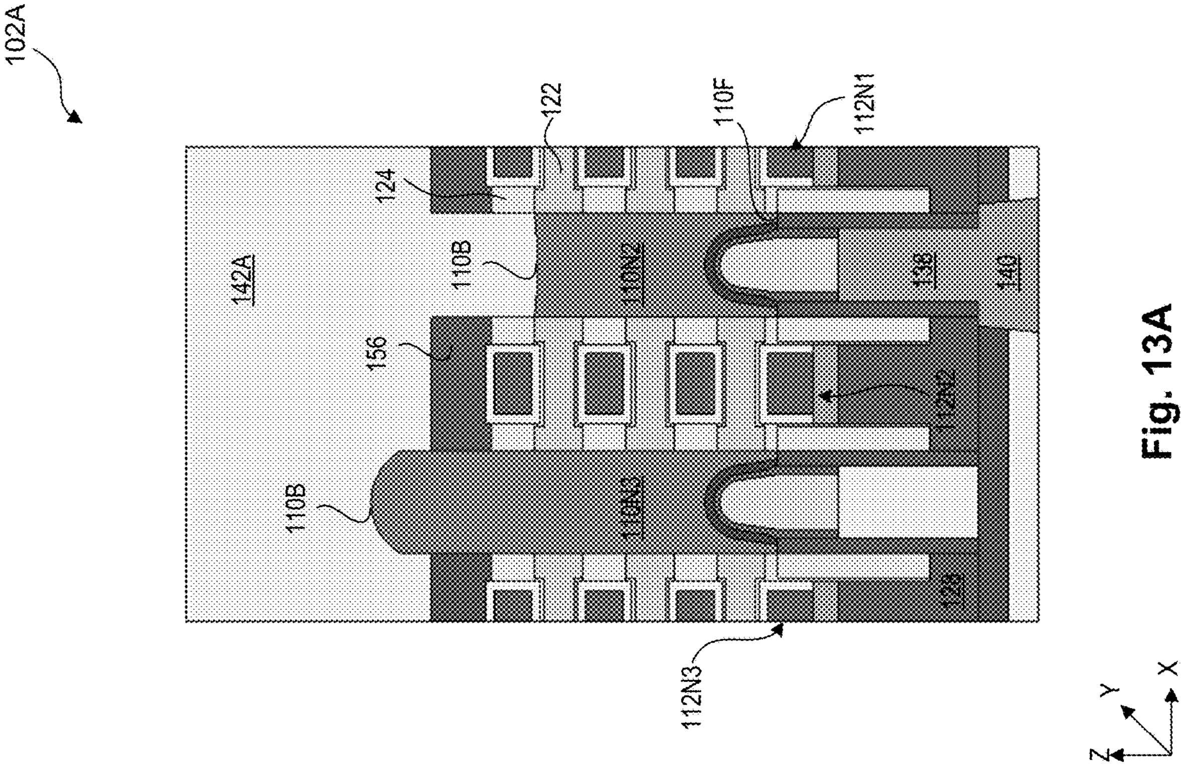

Referring to FIG. 2, in operation 220, the fin structures are replaced with a back-side ILD layer. For example, as described with respect to FIGS. 12A-13B, fin structures 108N-108P and substrate 106 (shown in FIGS. 11A-11B) are replaced with back-side ILD layer 142A. The replacement process can include sequential operations of (i) flipping the structures of FIGS. 11A-11B, (ii) performing a chemical mechanical polishing (CMP) process on back-side 106B of substrate 106 to thin down substrate 106 to a thickness of about 100 nm to about 200 nm (not shown), (iii) etching fin structures 108N-108P using a dry etching process, (iv) patterning a masking layer 1264 (e.g., a photoresist layer or a nitride layer), as shown in FIGS. 12A-12B, (v) selectively etching back-side surfaces 110B of S/D regions 110N2-110P2 through openings 1266 in masking layer 1264 using a dry etching process, as shown in FIGS. 12A-12B, and (v) depositing back-side ILD layer 142A on the structures of FIGS. 12A-12B after removing masking layer 1264 to form the structures of FIGS. 13A-13B.

Figure 14B:
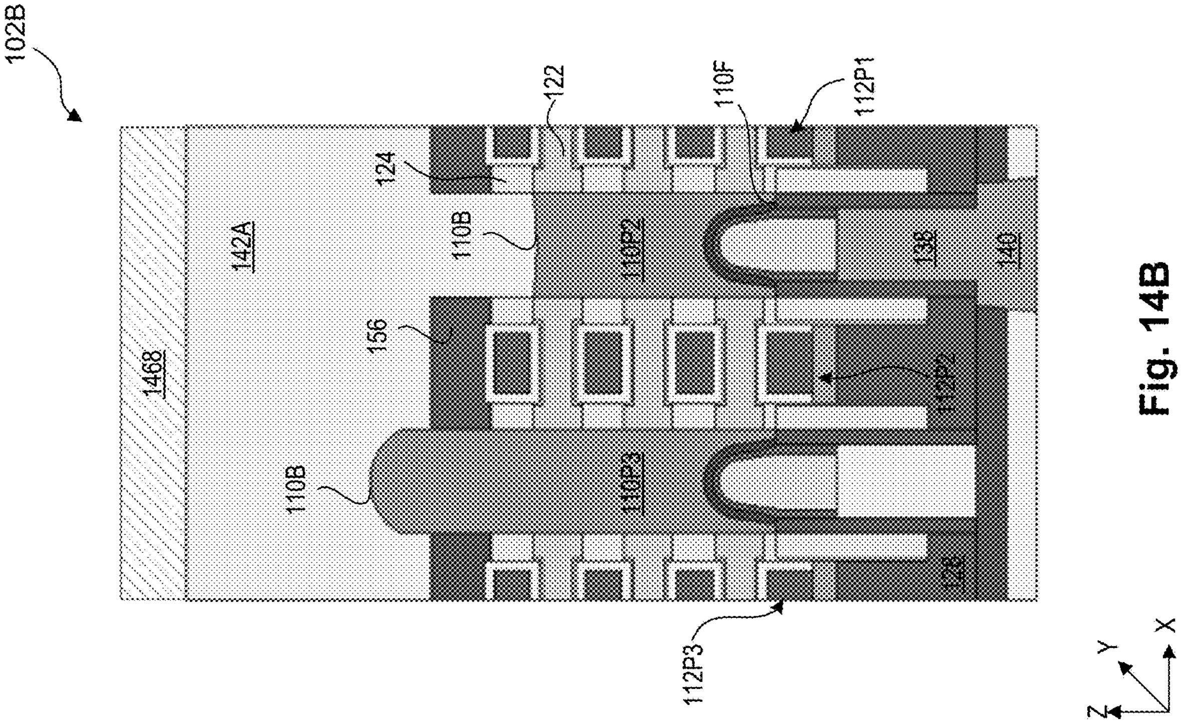
Figure 14A:
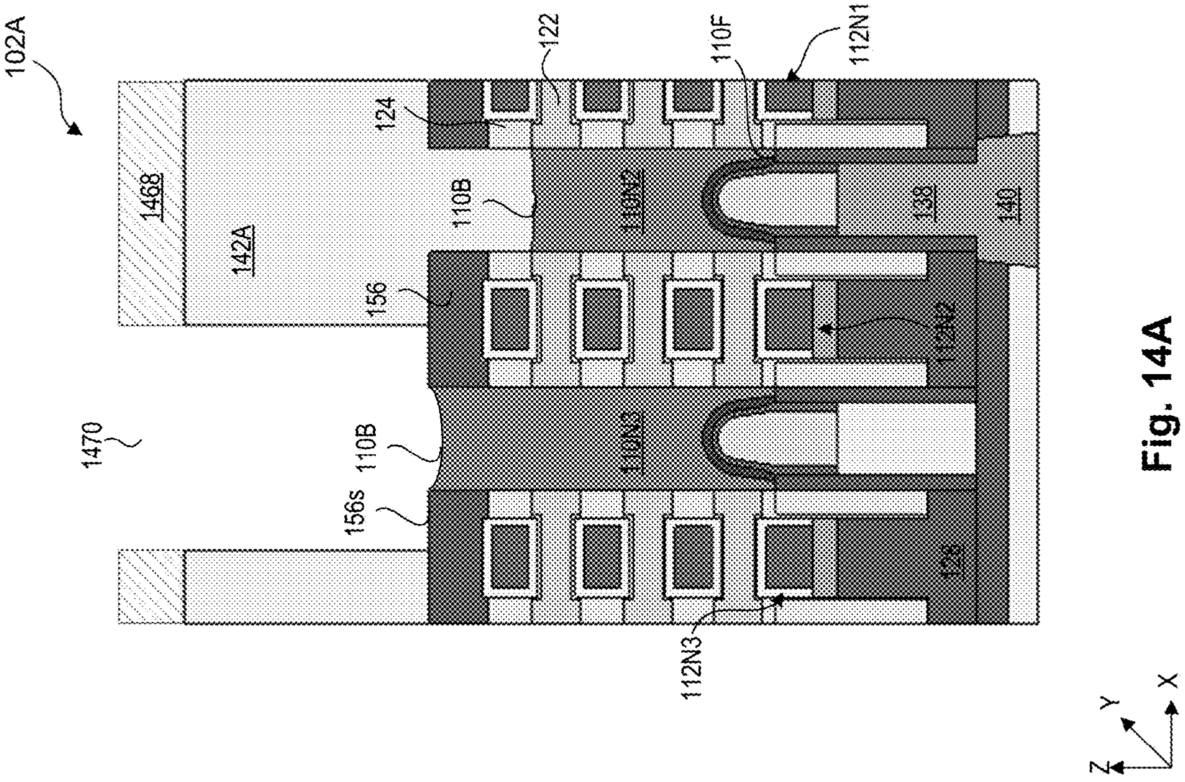
Figure 15B:
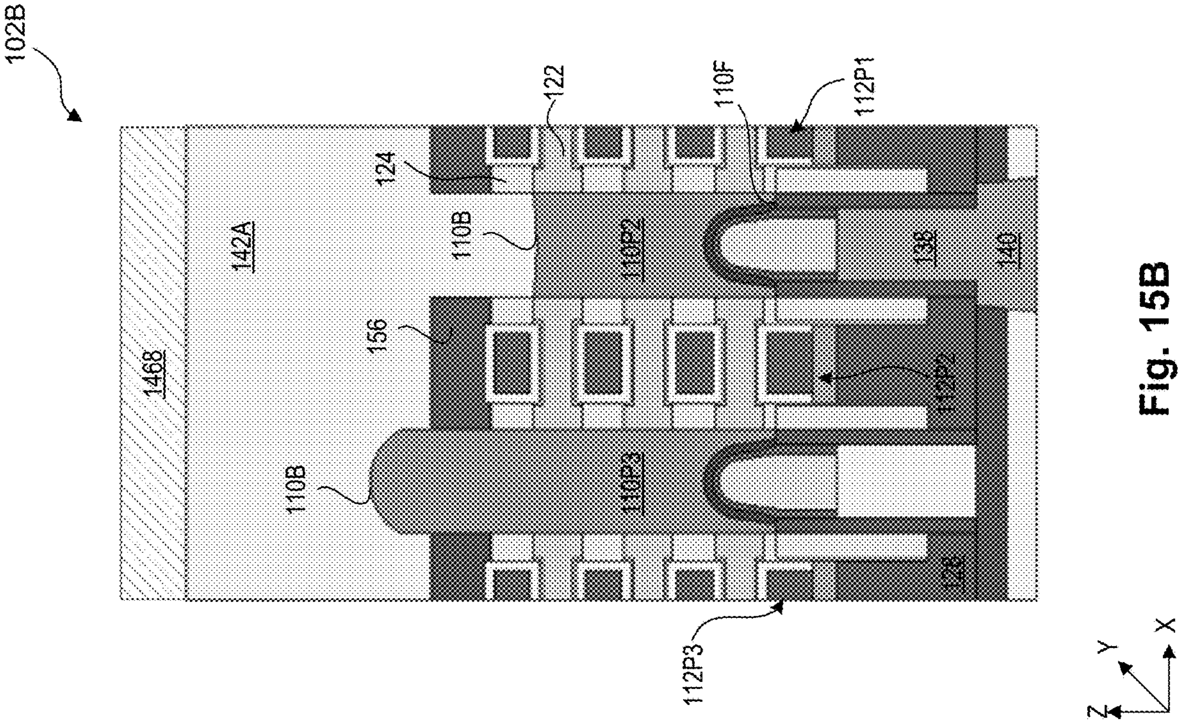
Figure 15A:
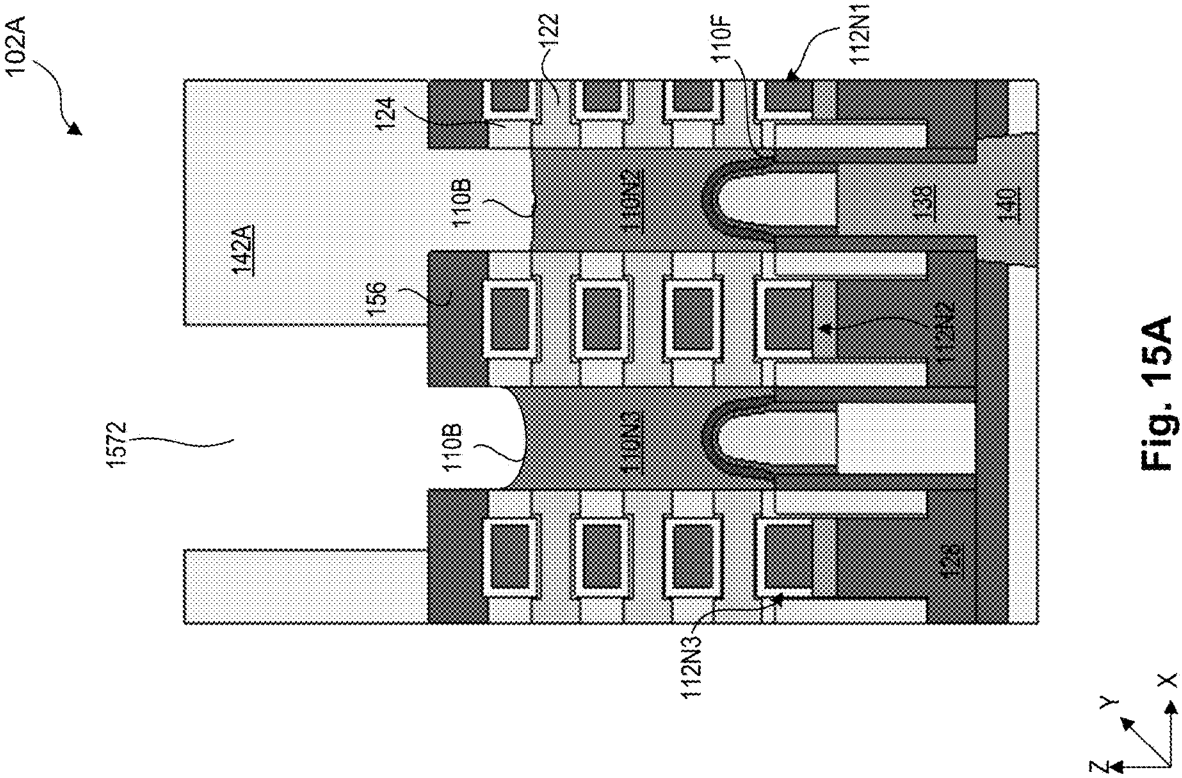

Referring to FIG. 2, in operation 225, a S/D contact opening is selectively formed on a back-side surface of one of the epitaxial S/D regions of the NFET. For example, as described with respect to FIGS. 14A-15B, a S/D contact opening 1572 ("back-side S/D contact opening 1572") is selectively formed on back-side surface 110B of S/D region 110N3. The formation of S/D contact opening 1572 can include sequential operations of (i) patterning a masking layer 1468 (e.g., a photoresist layer or a nitride layer) with an opening 1470 on the structures of FIGS. 13A-13B, as shown in FIGS. 14A-14B, (ii) performing a first etching process through opening 1470 to remove a portion of back-side ILD layer 142 that is not covered by masking layer 1468 and to remove a portion of S/D region 110N3 that extends over surface 156*s* of back-side HM layers 156 to form the structure of FIG. 14A, and (iii) performing a second etching process to remove another portion of S/D region 110N3 to expose sidewalls of back-side HM layers 156 that are within S/D contact opening 1572, as shown in FIG. 15A. The first etching process can use a chlorine-based or fluorine-based etching gas that has a higher etch selectivity (e.g., about 20 to 50 times higher) for the materials of ILD layer 142 and S/D region 110N3 than for the material of HM layers 156. The second etching process can use an etching gas that has a higher etch selectivity (e.g., about 20 to 50 times higher) for the material of S/D region 110N3 than for the materials of HM layers 156 and ILD layer 142.

Figure 16B:
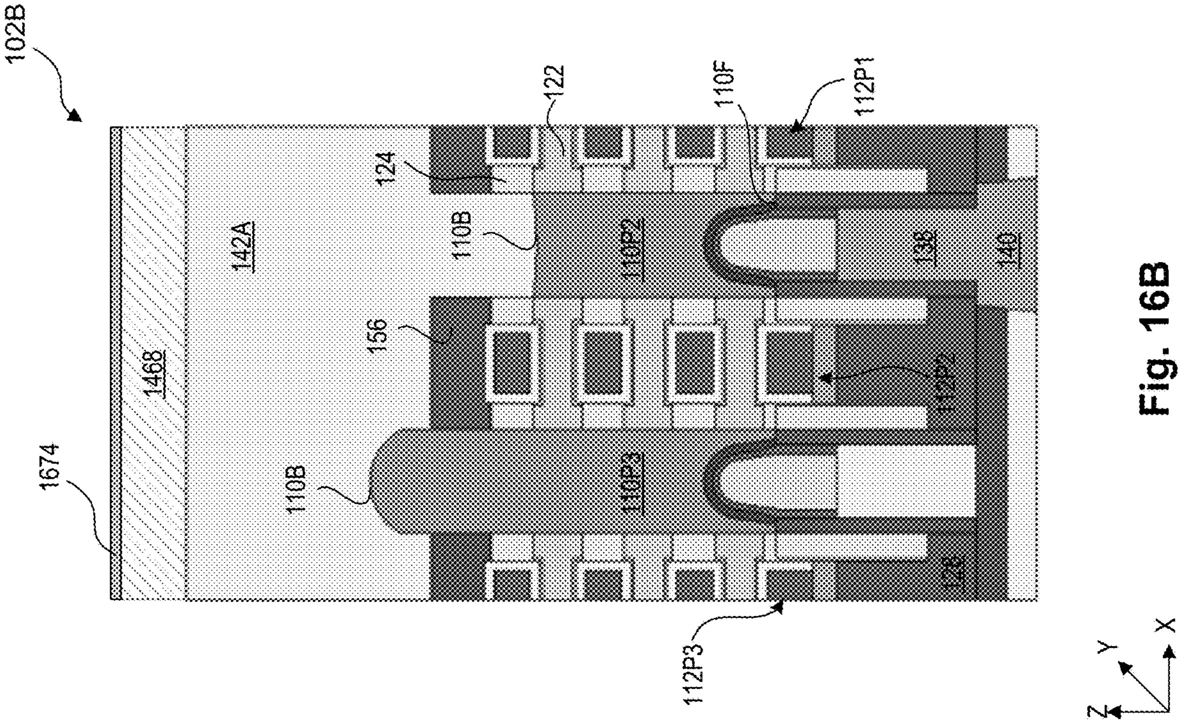
Figure 16A:
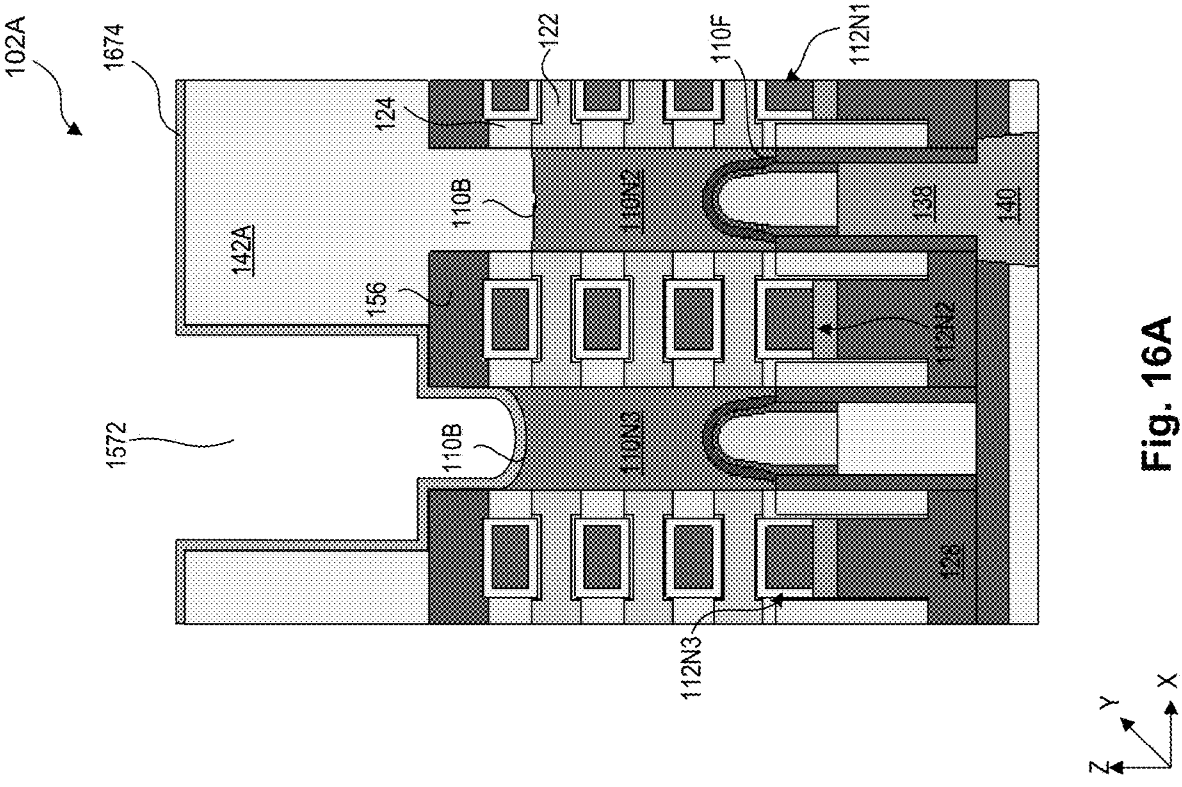
Figure 17B:
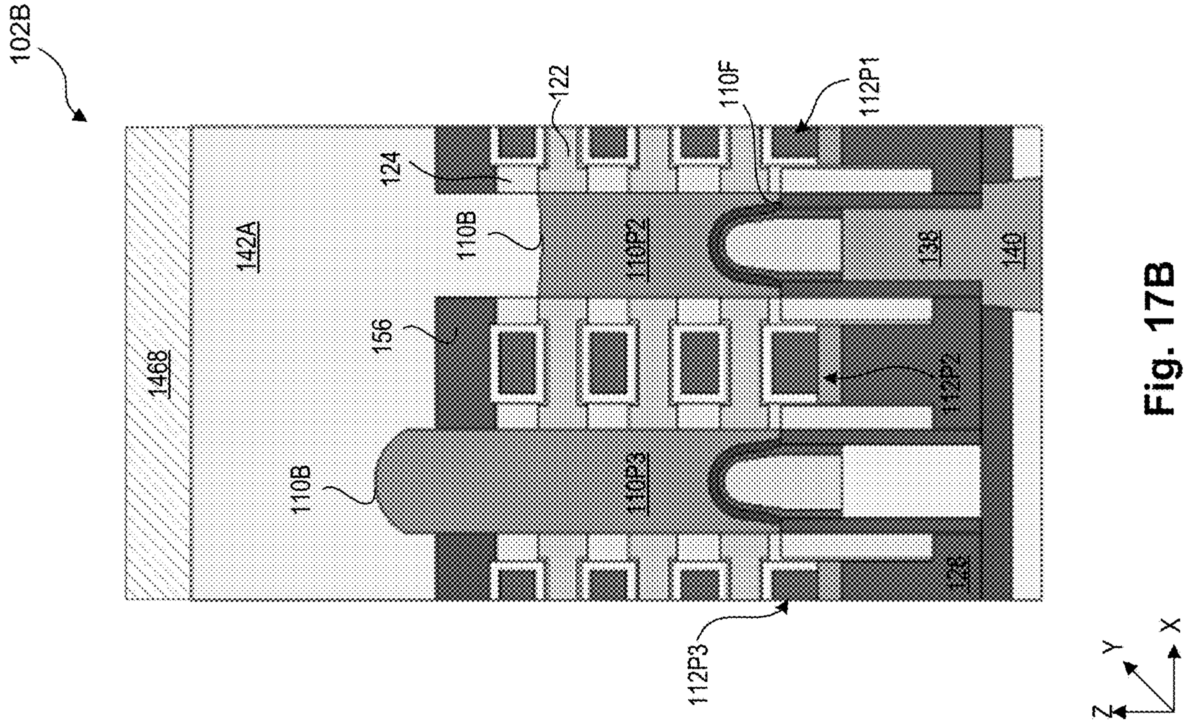
Figure 17A:
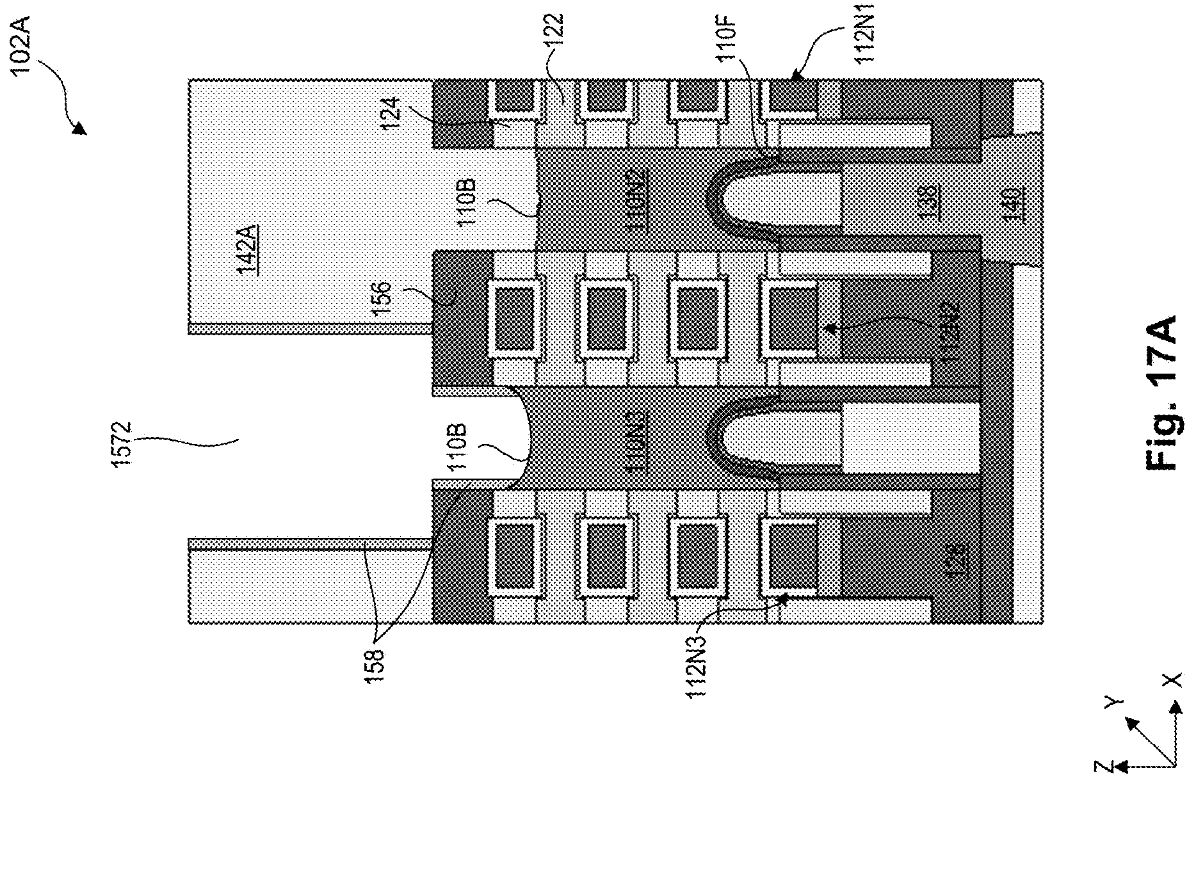

In some embodiments, back-side spacers 158 of NFET 102A can be formed after the formation of S/D contact opening 1572. The formation of NFET back-side spacers 158 can include sequential operations of (i) depositing an insulating layer 1674 on the structures of FIGS. 15A-15B, as shown in FIGS. 16A-16B and (ii) performing a directional etching process (e.g., an anisotropic etching process) to remove portions of insulating layer 1674 from horizontal surfaces of back-side ILD layer 142A and back-side HM layers 156 of NFET 102A and form back-side spacers 158 on sidewalls of S/D contact opening 1572, as shown in FIGS. 17A-17B. In some embodiments, the directional etching process can include a dry etching process that uses an etching gas mixture of hydrofluorocarbon ($CH_xF_y$) and oxygen ($O_2$) or sulfur hexafluoride ($SF_6$), hydrofluorocarbon ($CH_xF_y$), and helium (He), where x is about 1 to about 3 and y is about 4−x.

Figure 18B:
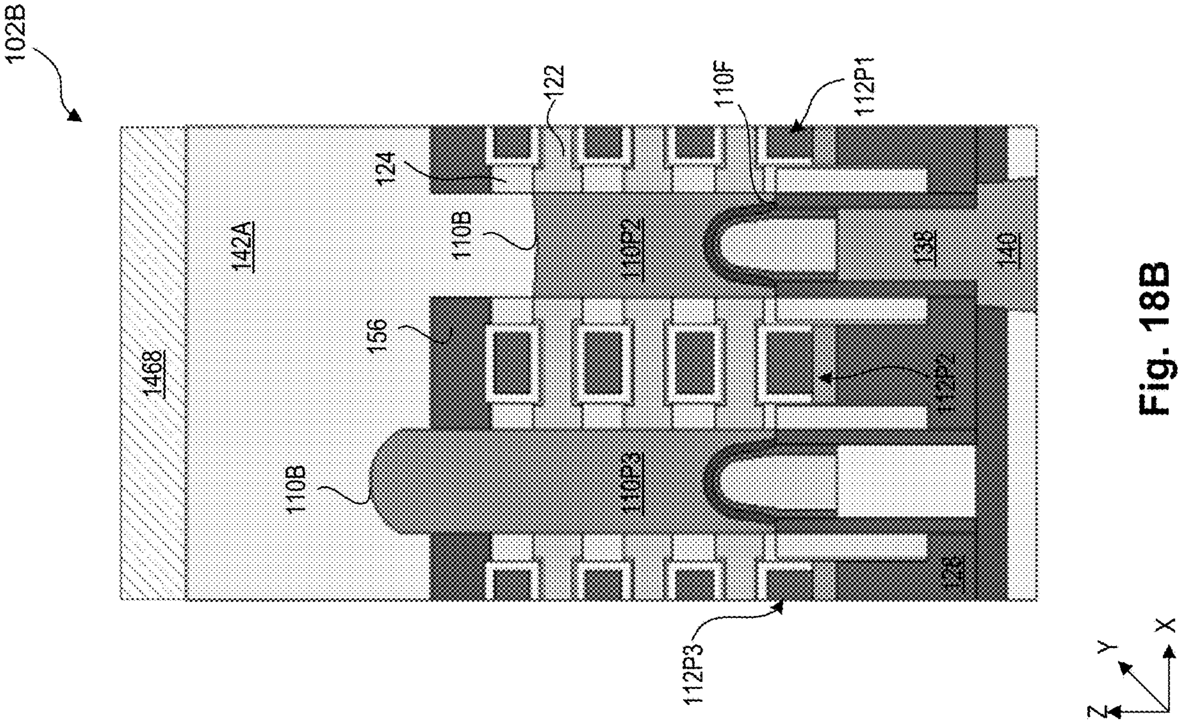
Figure 18A:
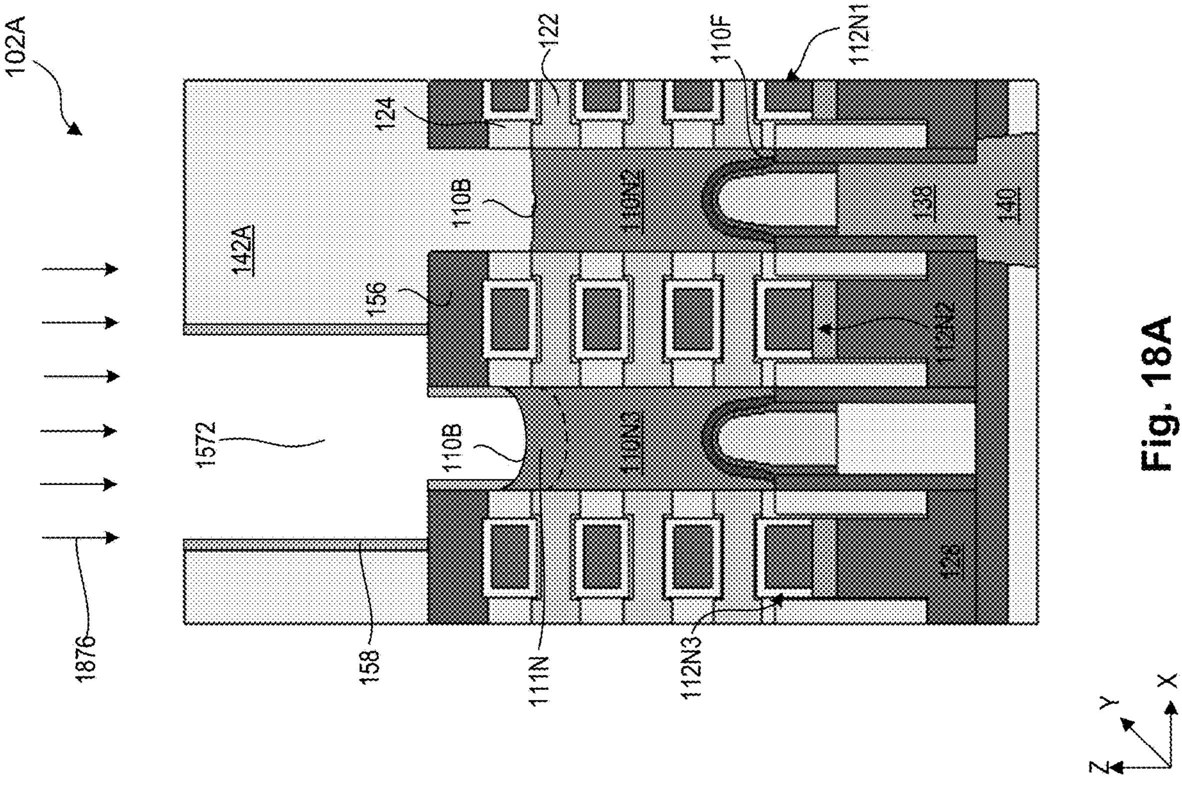
Figure 19B:
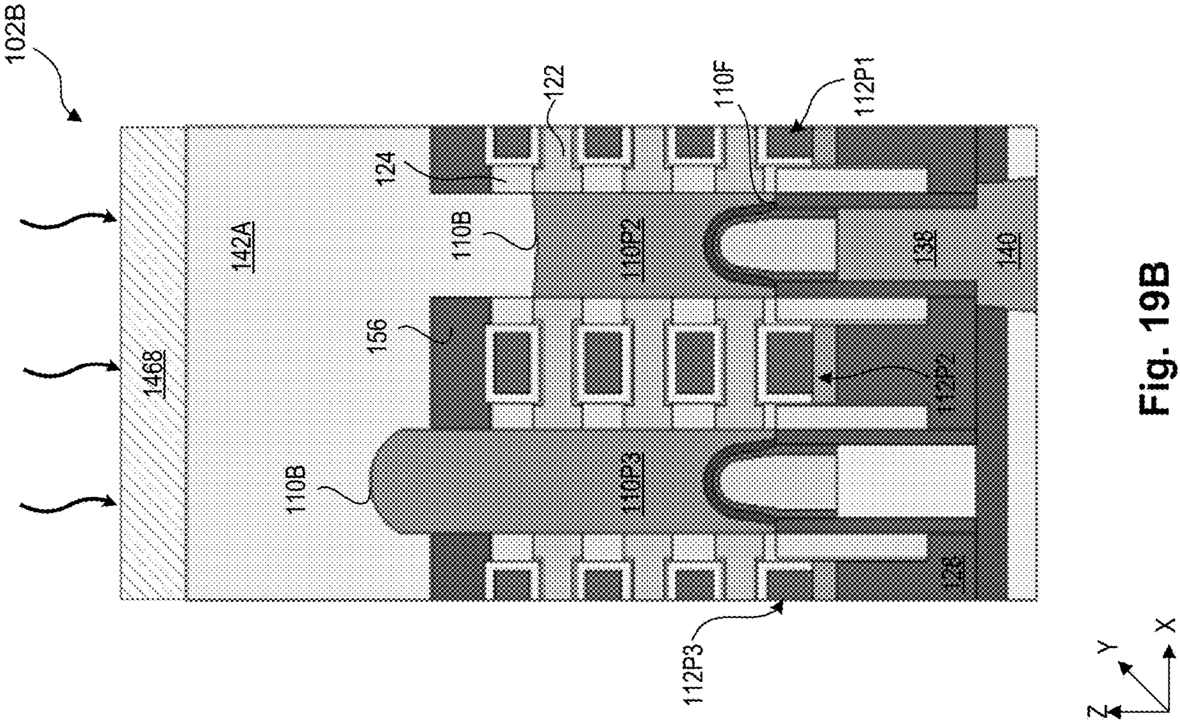
Figure 19A:
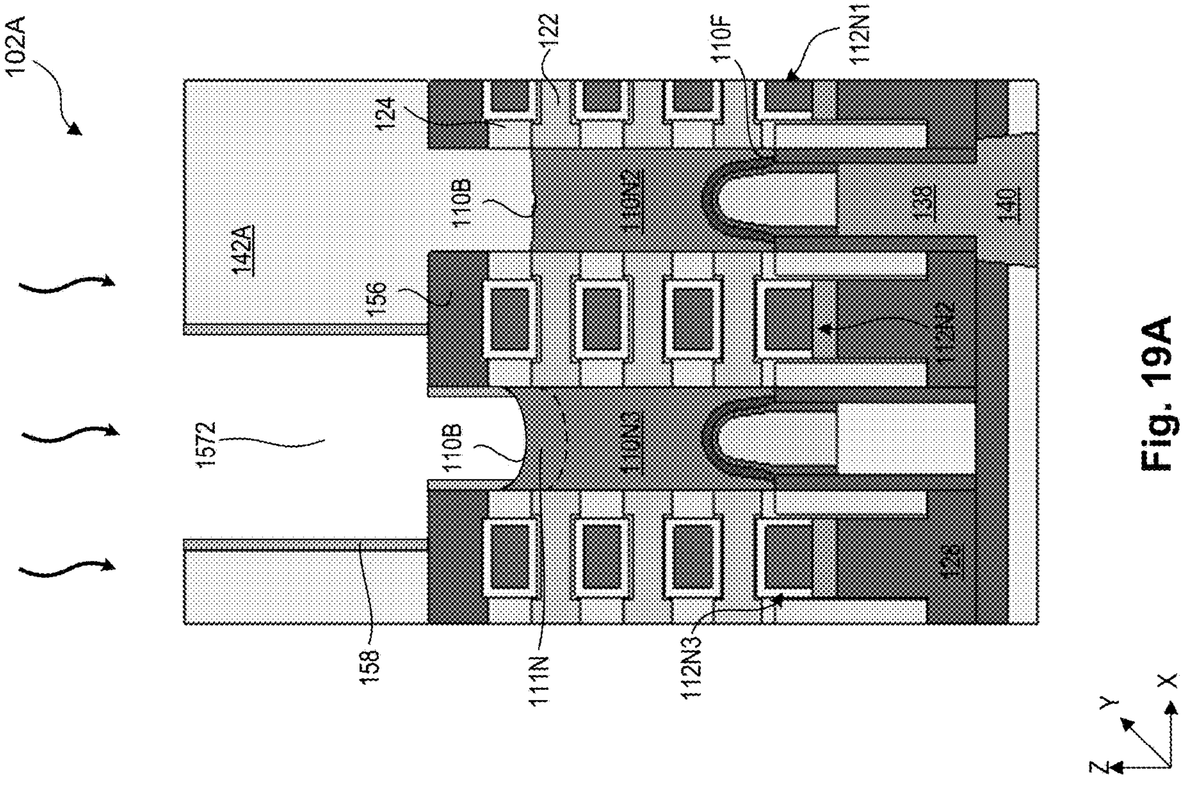

In some embodiments, after the formation of back-side spacers 158, highly-doped region 111N can be selectively formed in S/D region 110N3 by ion implanting n-type dopants 1876, as shown in FIG. 18A, followed by a thermal annealing process, as shown in FIGS. 19A-19B. The thermal annealing process can be performed in-situ in a $N_2$ ambient at a temperature ranging from about 200° C. to about 450° C. using a rapid thermal annealing (RTA) process, a spike annealing process, or a laser annealing process for a time period ranging from about 100 nanoseconds to about 100 microseconds.

Figure 20B:
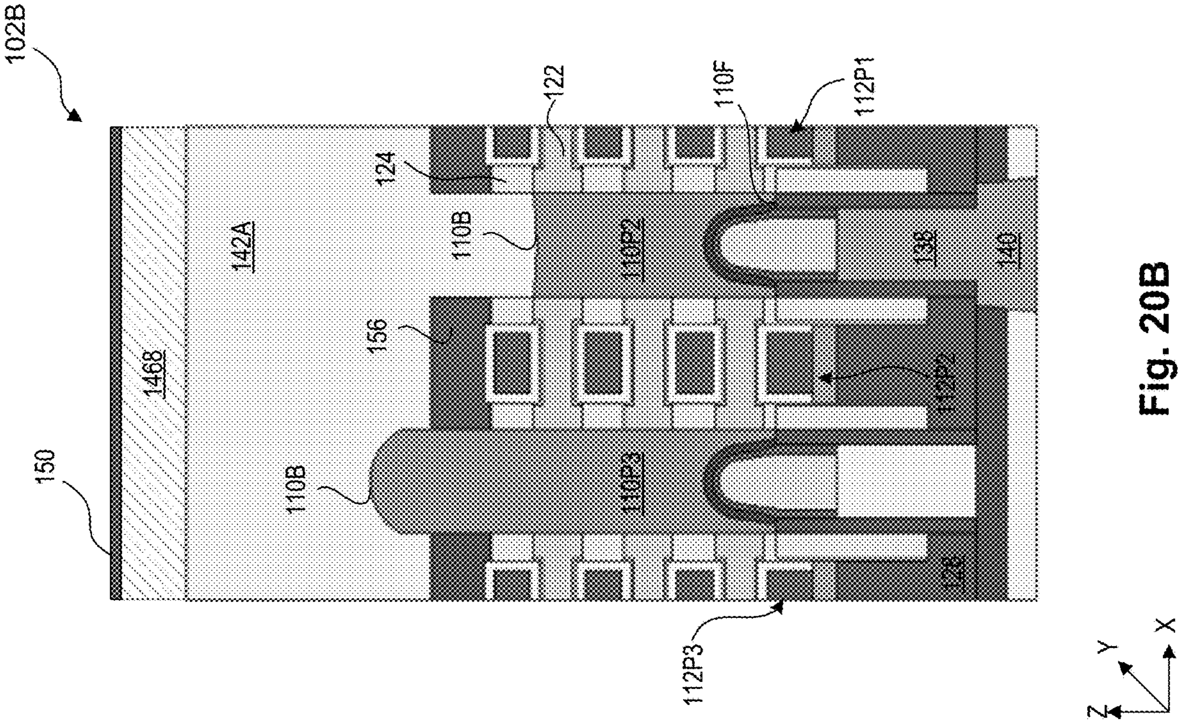
Figure 20A:
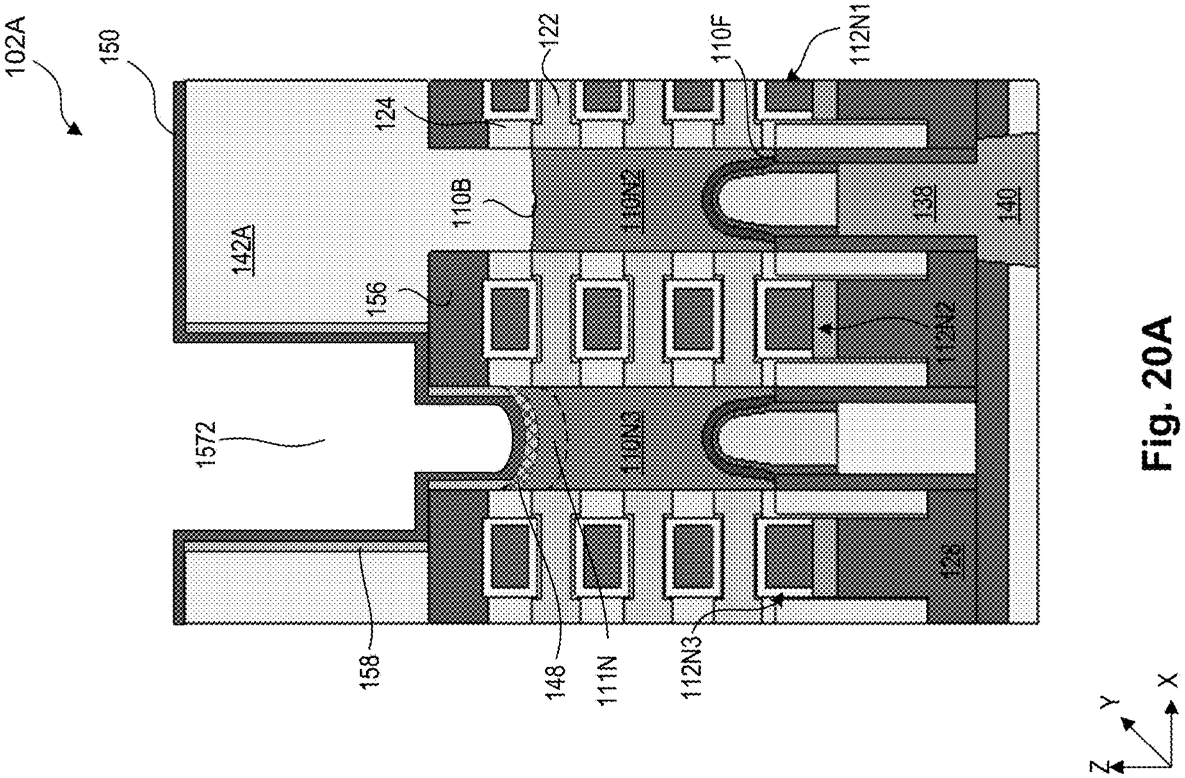

Referring to FIG. 2, in operation 230, an nWFM layer is deposited within the S/D contact opening of the NFET. For example, as shown in FIGS. 20A-20B, nWFM layer 150 is deposited on the structures of FIGS. 19A-19B. In some embodiments, depositing nWFM layer 150 can include depositing a metal with a work function value closer to a conduction band-edge energy than a valence band-edge energy of the material of S/D region 110N3 using a chemical vapor deposition (CVD) process or an atomic layer deposition (ALD) process at a temperature ranging from about 300° C. to about 500° C. For example, nWFM layer 150 can include a metal with a work function value less than 4.5 eV (e.g., about 3.5 eV to about 4.4 eV), which can be closer to the conduction band energy (e.g., 4.1 eV of Si or 3.8 eV of SiGe) than the valence band energy (e.g., 5.2 eV of Si or 4.8 eV of SiGe) of Si-based or SiGe-based material of S/D region 110N3. In some embodiments, the deposited metal can include Ti, Ta, Mo, Zr, Hf, Sc, Y, Ho, Tb, Gd, Lu, Dy, Er, Yb, or a combination thereof.

During the deposition of nWFM layer 150, nWFM silicide layer 148 can be formed at the interface between S/D region 110N3 and nWFM layer 150, as shown in FIG. 20A. The nWFM silicide layer 148 can be formed from a silicidation reaction between the materials of nWFM layer 150 and S/D region 110N3 at the deposition temperature of nWFM layer 150. Such nWFM silicide layer 148 can have a work function value closer to a conduction band-edge energy than a valence band-edge energy of the material of S/D region 110N3.

Figure 21B:
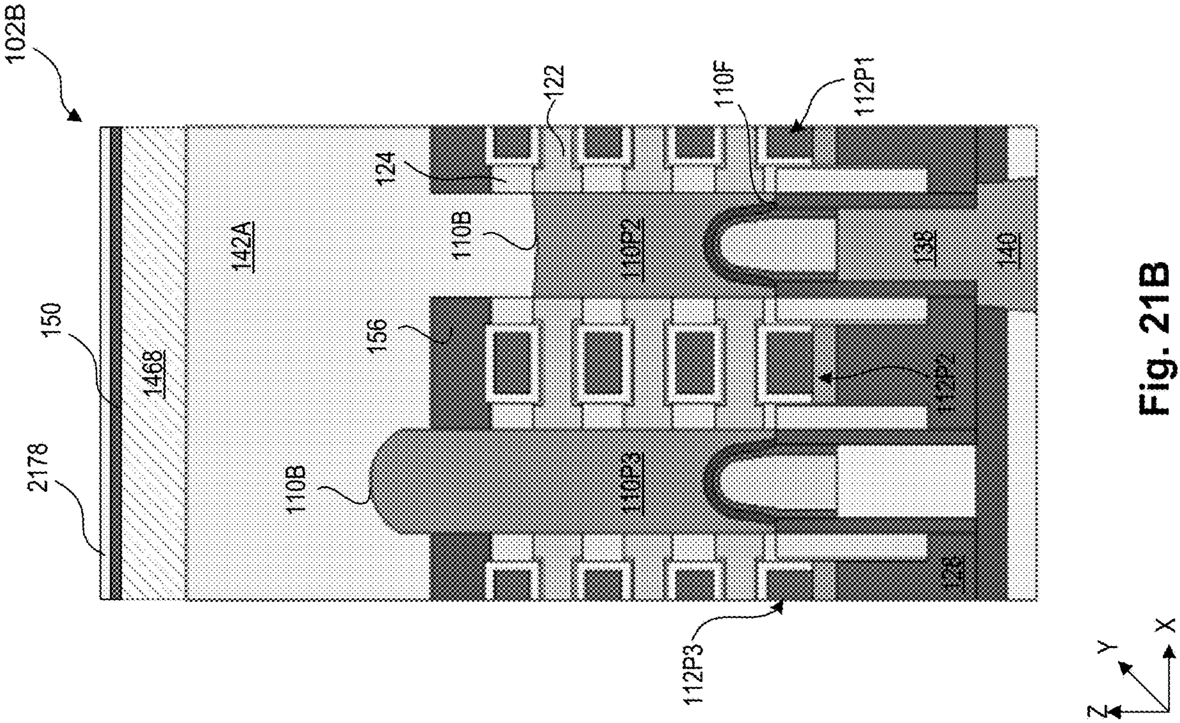
Figure 21A:
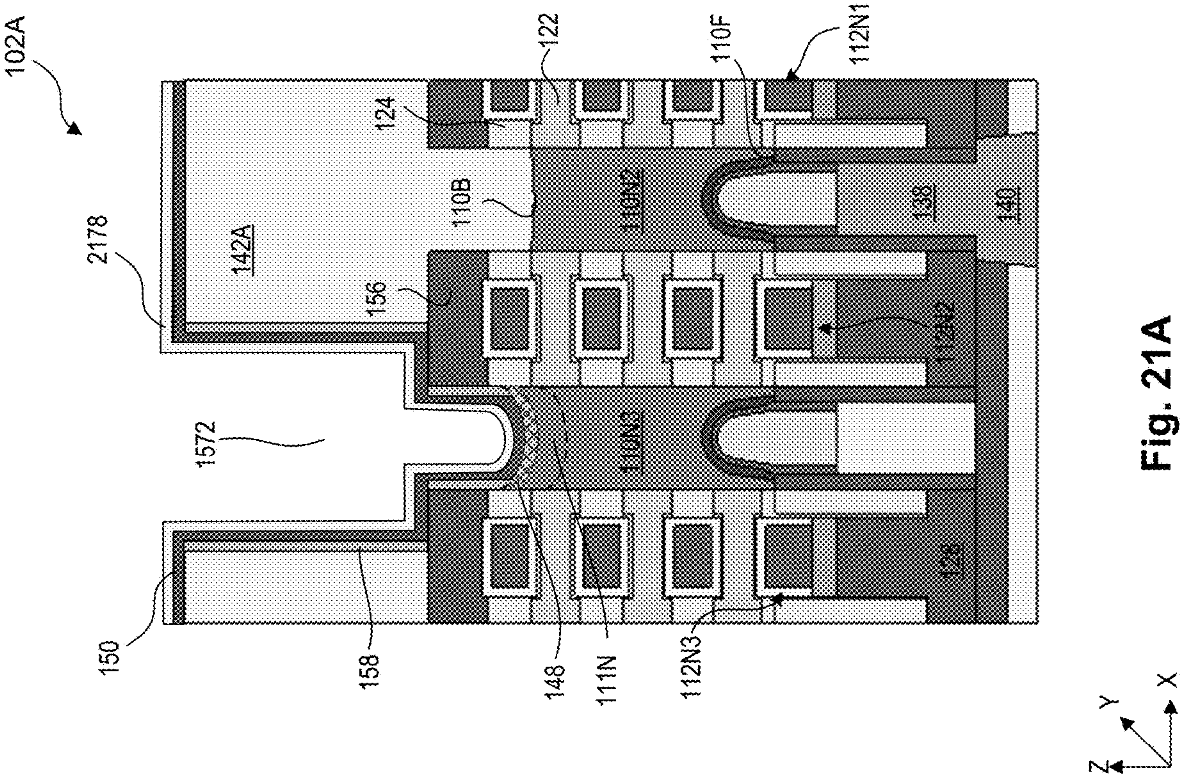

Referring to FIG. 2, in operation 235, a capping layer is deposited on the nWFM layer. For example, as shown in FIGS. 21A-21B, a capping layer 2178 is deposited on the structures of FIGS. 20A-20B. The deposition of capping layer 2178 can include depositing an insulating material, such as SiN, SiCN, SiOCN, $SiO_2$, and a high-k dielectric material, with a thickness of about 1 nm to about 5 nm. Below this range of thickness, capping layer 2178 may not adequately protect nWFM layer 150 from being oxidized during subsequent processing of NFET 102A and PFET 102A. On the other hand, if the thickness is greater than 5 nm, the deposition time for capping layer 2178 increases, and consequently increases device manufacturing cost.

Referring to FIG. 2, in operation 240, a S/D contact opening is selectively formed on a back-side surface of one of the epitaxial S/D regions of the PFET. For example, as described with respect to FIGS. 22A-22B, a S/D contact opening 2282 ("back-side S/D contact opening 2282") is selectively formed on back-side surface 110B of S/D region 110P3. The formation of S/D contact opening 2282 can be similar to the formation of S/D contact opening 1572, except a masking layer 2280 is formed on NFET 102A instead of PFET 102B, as shown in FIG. 22A. Similar to operation 225, the first etching process can remove a portion of back-side ILD layer 142 and a portion of S/D region 110P3 that extends over back-side HM layers 156, and the second etching process can remove another portion of S/D region 110N3 to expose sidewalls of back-side HM layers 156 to form the structure of FIG. 22B.

Figure 22B:
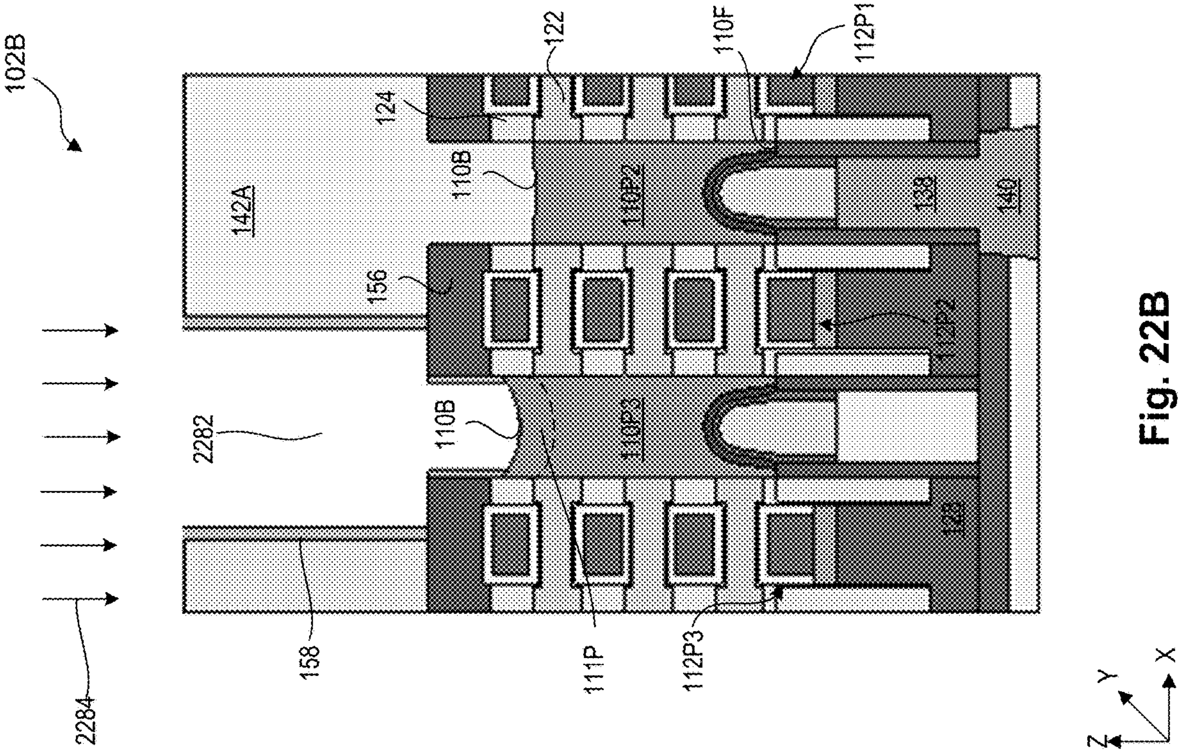
Figure 22A:
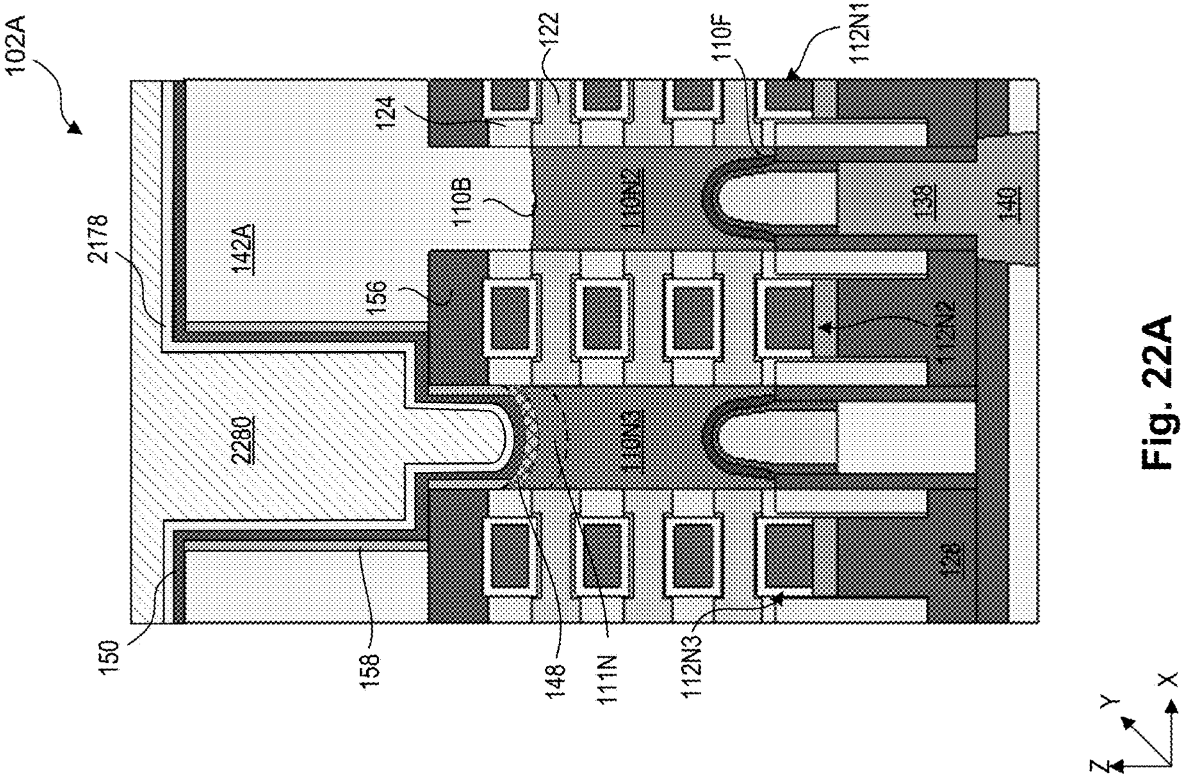

Similar to operation 225, back-side spacers 158 of PFET 102B can be formed, as shown in FIG. 22B, after the formation of S/D contact opening 2282 using the formation process of NFET back-side spacers 158. In some embodiments, after the formation of PFET back-side spacers 158, highly-doped region 111P can be selectively formed in S/D region 110P3 by ion implanting p-type dopants 2284, as shown in FIG. 22B, followed by a thermal annealing process performed on the structures of FIGS. 22A-22B. The thermal annealing process can be similar to the thermal annealing process of operation 225. Following the thermal annealing process, masking layer 2280 and capping layer 2178 are removed.

Figure 23B:
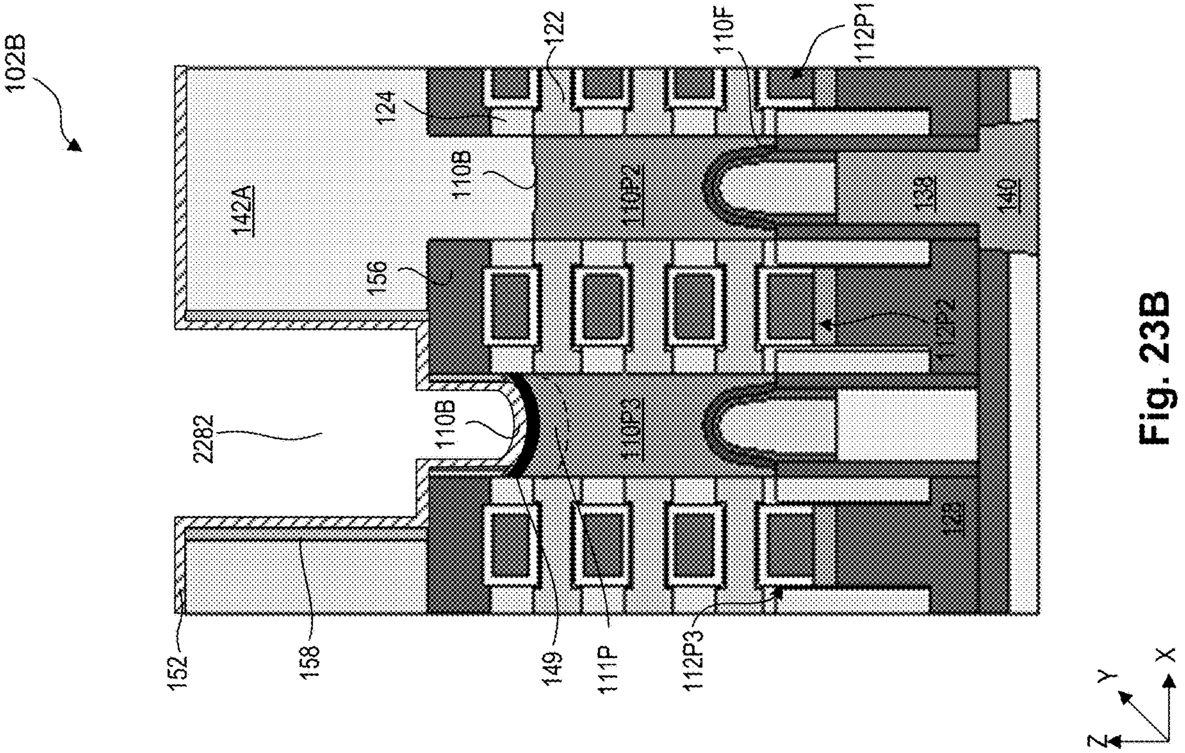
Figure 23A:
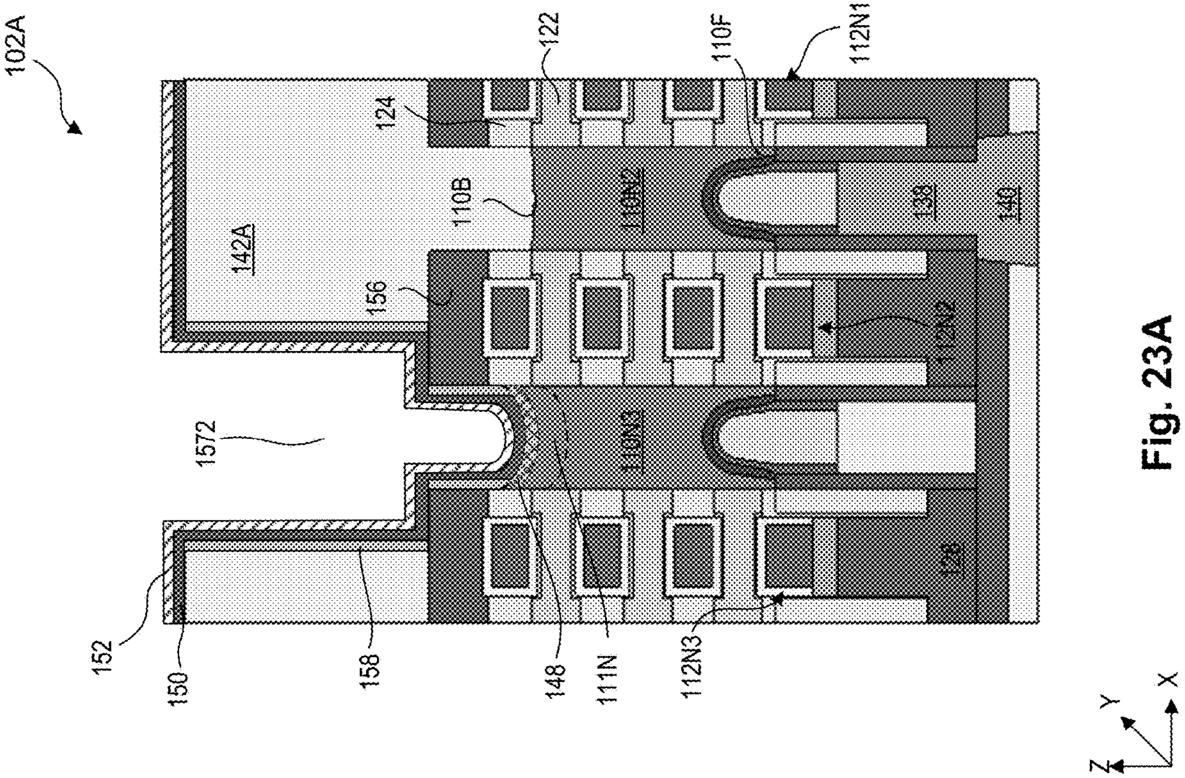

Referring to FIG. 2, in operation 245, a pWFM layer is deposited within the S/D contact openings of the NFET and PFET. For example, as shown in FIGS. 23A-23B, pWFM layer 152 is deposited on the structures of FIGS. 22A-22B after removing masking layer 2280 and capping layer 2178. In some embodiments, depositing pWFM layer 152 can include depositing a metal with a work function value closer to a valence band-edge energy than a conduction band-edge energy of the material of S/D region 110P3 using a CVD process or an ALD process at a temperature ranging from about 300° C. to about 500° C. For example, pWFM layer 152 can include a metal with a work function value greater than 4.5 eV (e.g., about 4.5 eV to about 5.5 eV), which can be closer to the valence band energy (e.g., 5.2 eV of Si or 4.8 eV of SiGe) than the conduction band energy (e.g., 4.1 eV of Si or 3.8 eV of SiGe) of Si-based or SiGe-based material of S/D region 110P3. In some embodiments, the deposited metal can include Ni, Co, Mn, W, Fe, Rh, Pd, Ru, Pt, Ir, Os, or a combination thereof.

During the deposition of pWFM layer 152, pWFM silicide layer 149 can be formed at the interface between S/D region 110P3 and pWFM layer 152, as shown in FIG. 23B. The pWFM silicide layer 149 can be formed from a silicidation reaction between the materials of pWFM layer 152 and S/D region 110P3 at the deposition temperature of pWFM layer 152. Such pWFM silicide layer **14*p* can have a work function value closer to a valence band-edge energy than a conduction band-edge energy of the material of S/D region 110P3. In some embodiments, during the deposition of pWFM layer 152, a metal alloy layer 153 (shown in FIG. 1B) can be formed at the interface between nWFM and pWFM layers 150-152 within S/D contact opening 1572. The thermal energy from the deposition temperature of pWFM layer 152 can cause diffusion and mixing of metals of nWFM and pWFM layers 150-152 at the interface, resulting in the formation of metal alloy layer 153**.

Figure 24B:
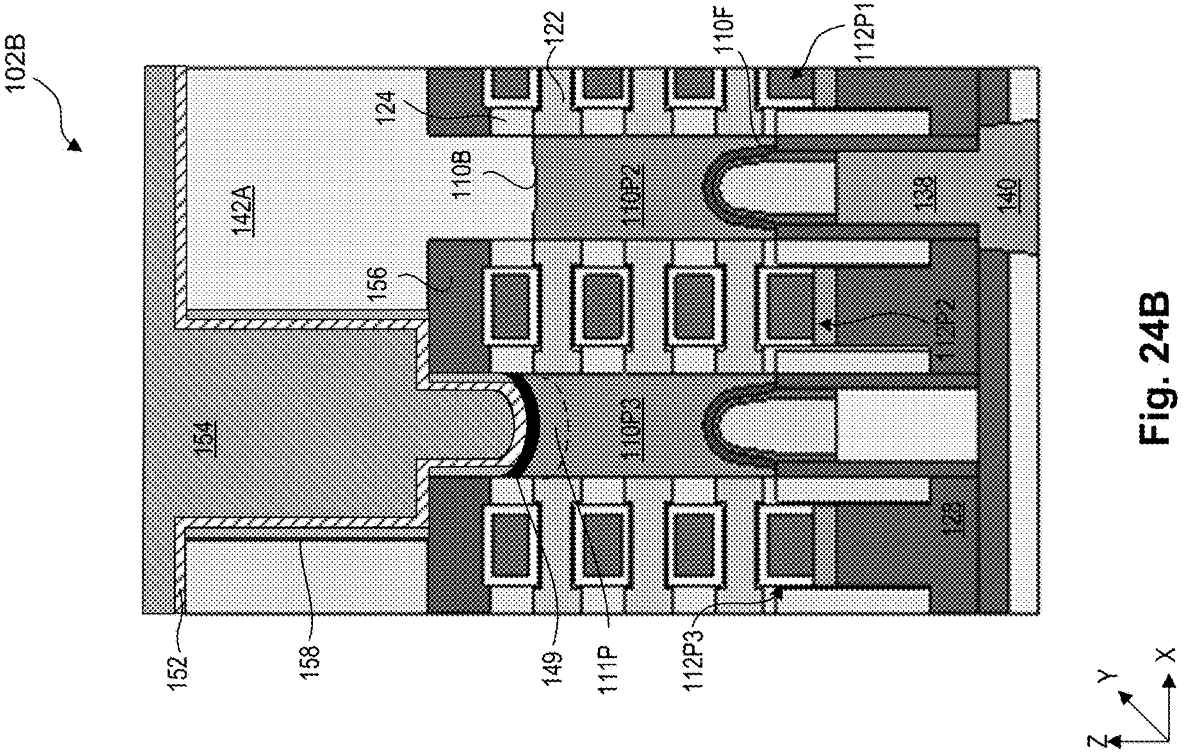
Figure 24A:
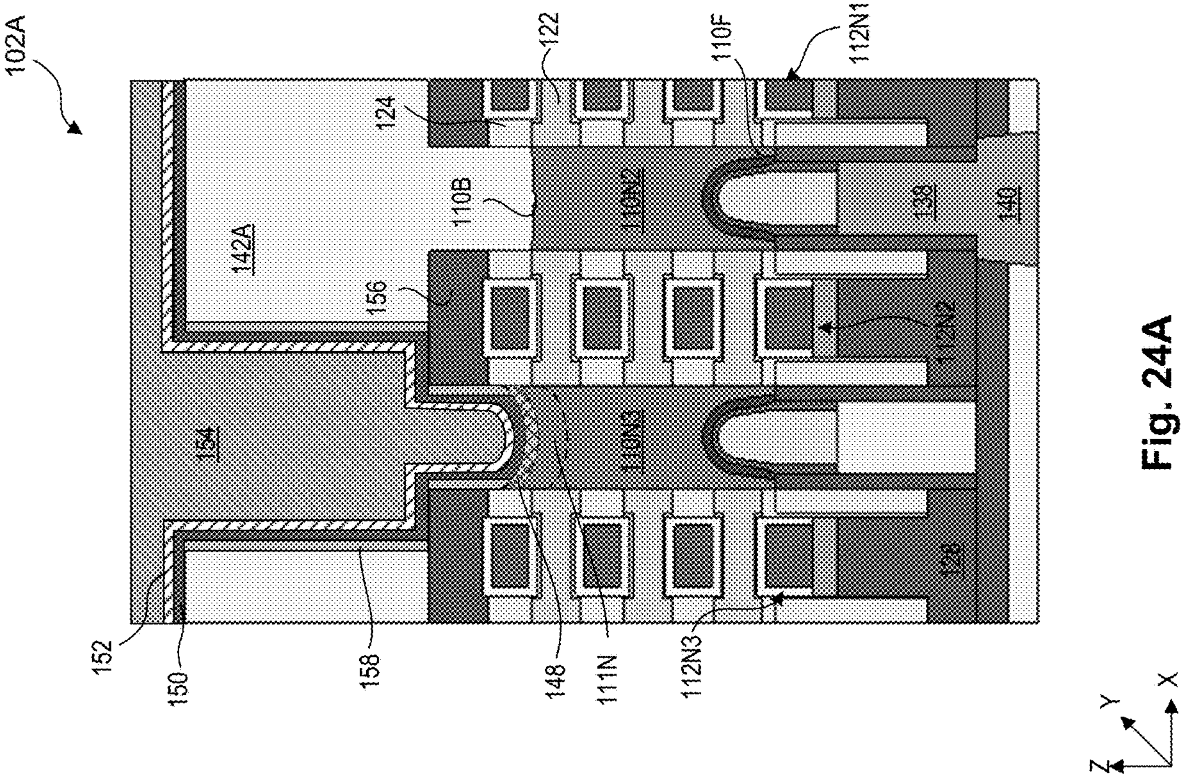
Figure 25B:
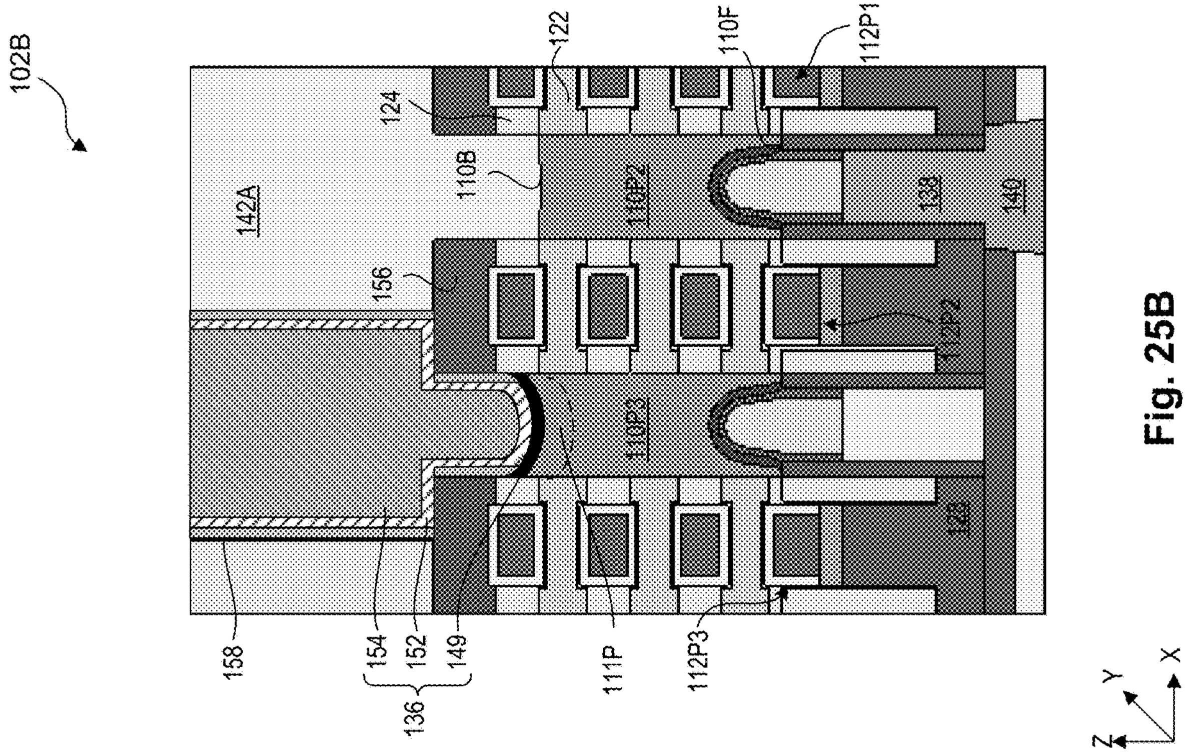
Figure 25A:
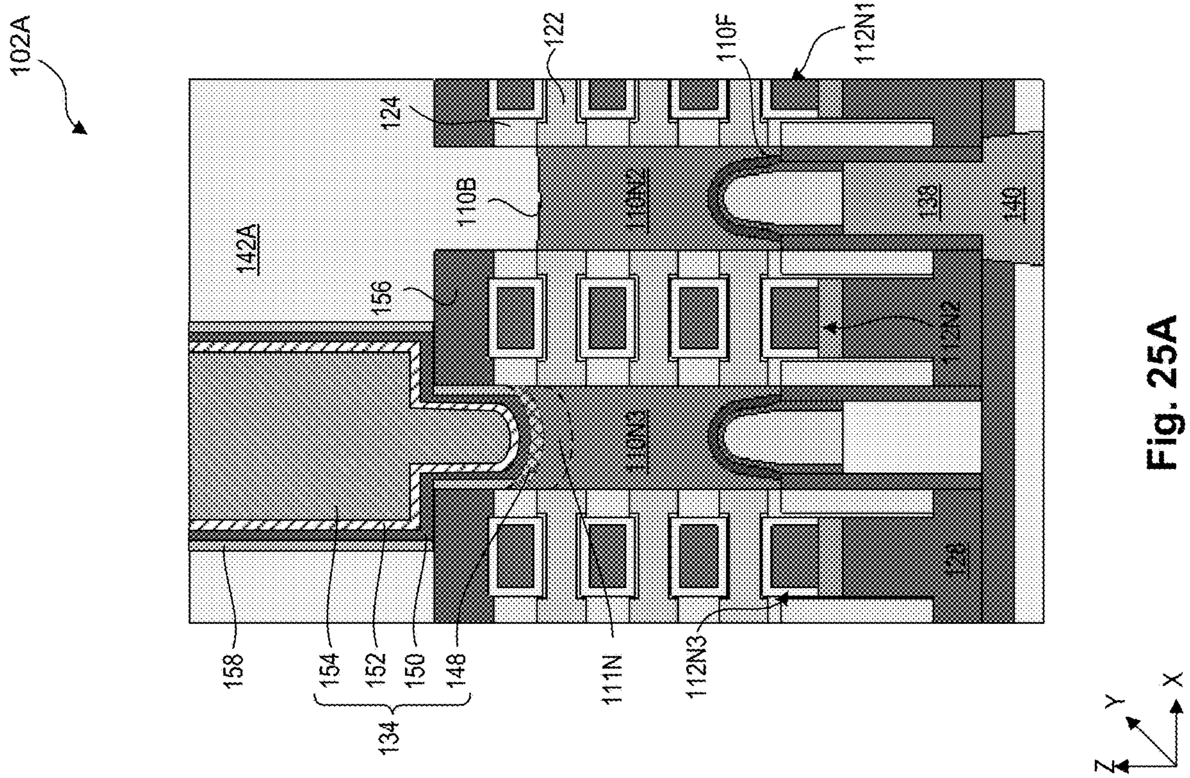

Referring to FIG. 2, in operation 250, contact plugs are formed within the S/D contact openings of the NFET and PFET. For example, as described with respect to FIGS. 24A-25B, contact plugs 154 are formed within S/D contact openings 1572 and 2282. The formation of contact plugs 154 can include filling S/D contact openings 1572 and 2282 with a conductive material, as shown in FIGS. 24A-24B and performing a CMP process on the structures of FIGS. 24A-24B, to form S/D contact structures 134 and 136 of FIGS. 25A-25B. The CMP process can substantially coplanarize top surfaces of back-side ILD layer 142, back-side spacers 158, nWFM layer 150, pWFM layer 152, and contact plug 154 with each other, as shown in FIGS.

Figure 26B:
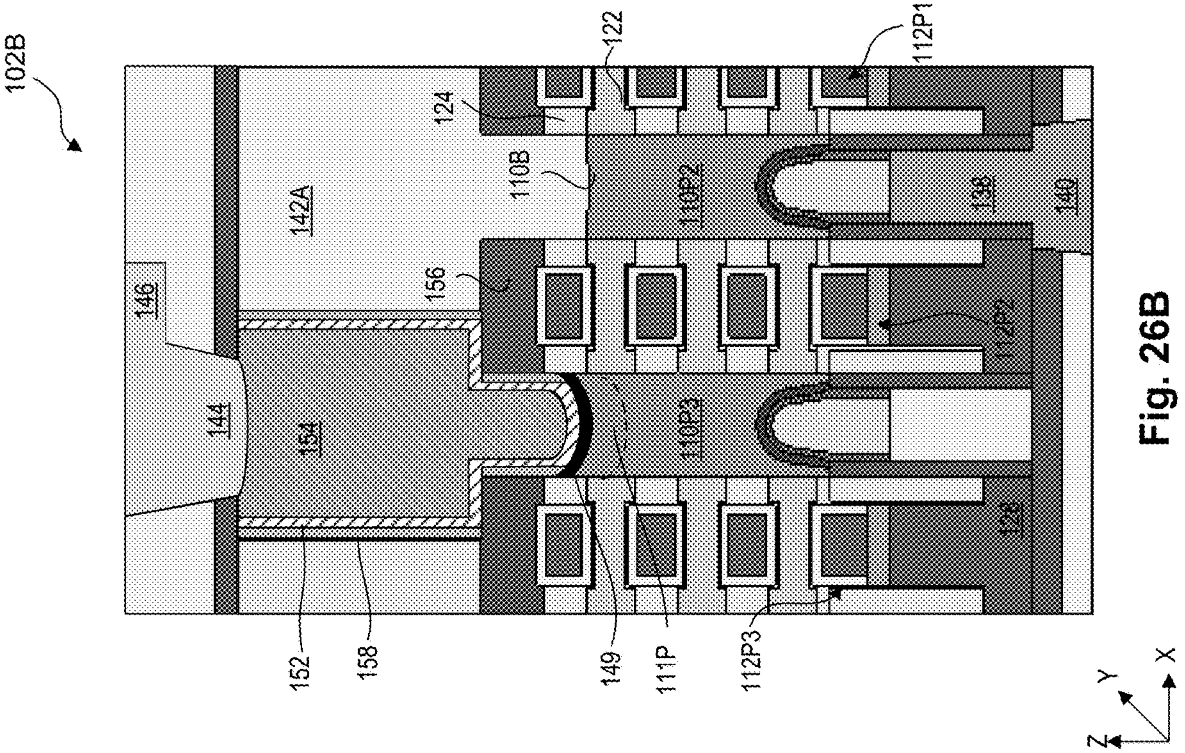
Figure 26A:
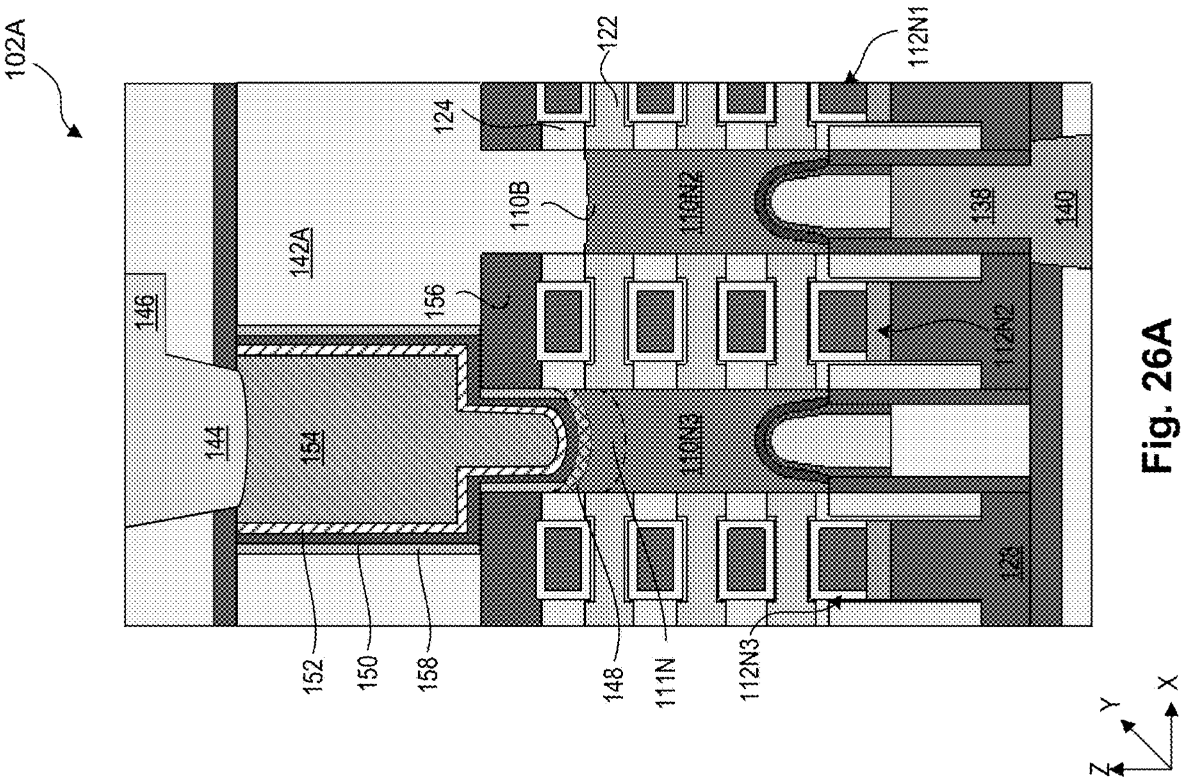

25A-25B. In some embodiments, after the CMP process, back-side ESL 160, back-side ILD layer 142B, back-side via plugs 144, and back-side metal lines 146 can be formed on the structures of FIGS. 25A-25B, as shown in FIGS. 26A-26B.

The present disclosure provides example semiconductor devices (e.g., semiconductor device 100) with dual side source/drain (S/D) contact structures (e.g., S/D contact structures 130 and 134) and provides example methods (e.g., method 200) of forming such semiconductor devices with reduced contact resistance between S/D regions (e.g., S/D region 110N3-110P3) and S/D contact structures (e.g., S/D contact structures 134 and 136). The example method forms arrays of epitaxial S/D regions (e.g., epitaxial S/D regions 110N1-110N3 and 110P1-110P3) and gate structures (e.g., gate structures 112N1-112N3 and 112P1-112P3) on fin structures of NFET (e.g., NFET 102A) and PFET (e.g., PFET 102B) of the semiconductor device. In some embodiments, adjacent pairs of S/D regions in the arrays have S/D contact structures that are formed on opposite sides of the semiconductor device. One of the S/D contact structures (e.g., S/D contact structure 130) of the adjacent pairs of S/D regions are formed on a first side ("front side") of the semiconductor device. The other S/D contact structures e.g., S/D contact structure 134) of the adjacent pairs of S/D regions are formed on a second side ("back-side") of the semiconductor device.

In some embodiments, since the epitaxial S/D regions of NFET and PFET are formed with respective n-type and p-type materials, the back-side S/D contact structures of NFET and PFET are formed with silicide layers (e.g., silicide layers 148-149) different from each other to reduce the contact resistances between the S/D contact structures and the different materials of the S/D regions. In some embodiments, the NFET S/D contact structures are formed with nWFM silicide layers (e.g., TiSi) that have a work function value closer to a conduction band energy than a valence band energy of the n-type S/D regions. In contrast, the PFET S/D contact structures are formed with pWFM silicide layers (e.g., NiSi) that have a work function value closer to a valence band energy than a conduction band energy of the p-type S/D regions. Such selective formation of WFM silicide layers in NFETs and PFETs of semiconductor devices can reduce the contact resistances of the semiconductor devices by about 50% to about 70%, and consequently improve the performance of the semiconductor devices.

In some embodiments, a method includes forming a fin structure on a substrate, forming a superlattice structure on the fin structure, forming first and second S/D regions within the superlattice structure, forming a gate structure between the first and second S/D regions, forming first and second contact structures on first surfaces of the first and second S/D regions, and forming a third contact structure, on a second surface of the first S/D region, with a work function metal (WFM) silicide layer and a dual metal liner. The second surface is opposite to the first surface of the first S/D region. The WFM silicide layer has a work function value closer to a conduction band energy than a valence band energy of a material of the first S/D region.

In some embodiments, a method includes forming first and second fin structures on a substrate, forming a superlattice structure on the first and second fin structures, forming first and second source/drain (S/D) regions on the first and second fin structures, respectively, forming first and second gate-all-around (GAA) structures adjacent to the first and second S/D regions, respectively, forming first and second contact structures on first surfaces of the first and second S/D regions, respectively, forming a third contact structure, on a second surface of the first S/D region, with an n-type work function metal (WFM) silicide layer, wherein the n-type WFM silicide layer has a work function value closer to a conduction band energy than a valence band energy of a material of the first S/D region, and forming a fourth contact structure, on a second surface of the second S/D region, with a p-type WFM silicide layer. The p-type WFM silicide layer has a work function value closer to a valence band energy than a conduction band energy of a material of the second S/D region. The second surfaces of the first and second S/D regions are opposite to the first surfaces of the first and second S/D regions.

In some embodiments, a semiconductor device includes first and second source/drain (S/D) regions, a gate structure disposed between the first and second S/D regions, first and second contact structures disposed on first surfaces of the first and second S/D regions, and a third contact structure disposed on a second surface of the first S/D region. The second surface is opposite to the first surface of the first S/D region. The third contact structure includes a work function metal (WFM) silicide layer and a dual metal liner. The WFM silicide layer has a work function value closer to a conduction band energy than a valence band energy of a material of the first S/D region.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a source/drain (S/D) region; and
a contact structure, comprising:
a silicide layer disposed on the S/D region;
a first metal layer disposed on and in physical contact with the silicide layer;
a second metal layer disposed on the first metal layer;
a metal alloy layer disposed between the first and second metal layers; and
a third metal layer disposed on the second metal layer.

2. The semiconductor device of claim 1, wherein the contact structure is disposed on a first surface of the S/D region, and further comprising an other contact structure disposed on a second surface of the S/D region.

3. The semiconductor device of claim 1, wherein the contact structure comprises:
a first portion with a rectangular-shaped cross-sectional profile; and
a second portion with a U-shaped cross-sectional profile.

4. The semiconductor device of claim 1, wherein the contact structure comprises:
a first portion surrounded by a nitride layer; and
a second portion surrounded by an oxide layer.

5. The semiconductor device of claim 1, further comprising a gate structure adjacent to the S/D region, wherein the contact structure overlaps the gate structure along a direction perpendicular to a top surface of the S/D region.

6. The semiconductor device of claim 1, further comprising a nanostructured channel region adjacent to the S/D region, wherein the contact structure overlaps the nanostructured channel region along a direction perpendicular to a top surface of the S/D region.

7. The semiconductor device of claim 1, wherein the silicide layer comprises a metal of the first metal layer.

8. The semiconductor device of claim 1, wherein the first metal layer comprises an n-type work function metal (WFM) and the second metal layer comprises a p-type WFM.

9. The semiconductor device of claim 1, further comprising a gate spacer disposed on and in contact with the silicide layer.

10. The semiconductor device of claim 1, further comprising a hard mask layer disposed on and in contact with the first metal layer.

11. A semiconductor device, comprising:
- a doped region comprising a first surface and a second surface opposite to the first surface;
- first and second silicide layers disposed on the first and second surfaces, respectively;
- first and second metal layers disposed on the first and second silicide layers, respectively;
- a metal alloy layer disposed on the second metal layer;
- a third metal layer disposed on and in contact with the first metal layer; and
- a fourth metal layer disposed on and in contact with the metal alloy layer.

12. The semiconductor device of claim 11, wherein the doped region comprises:
- a first region with a first dopant concentration adjacent to the first silicide layer; and
- a second region with a second dopant concentration adjacent to the second silicide layer, wherein the second dopant concentration is greater than the first dopant concentration.

13. The semiconductor device of claim 11, wherein the second metal layer comprises an n-type work function metal (WFM) and the fourth metal layer comprises a p-type WFM.

14. The semiconductor device of claim 11, further comprising a gate spacer disposed on and in contact with the second silicide layer.

15. The semiconductor device of claim 11, wherein the fourth metal layer comprises:
- a first layer portion adjacent to a nitride layer; and
- a second layer portion adjacent to an oxide layer.

16. The semiconductor device of claim 11, further comprising a gate structure adjacent to the doped region, wherein the fourth metal layer overlaps the gate structure along a direction perpendicular to a top surface of the doped region.

17. A method, comprising:
- forming a source/drain (S/D) region on a substrate;
- forming a first contact structure on a first surface of the S/D region; and
- forming a second contact structure, comprising:
  - forming a silicide layer on a second surface of the S/D region;
  - depositing an n-type work function metal (WFM) layer on the silicide layer;
  - depositing a p-type WFM layer on the n-type WFM layer; and
  - depositing a metal fill layer on the p-type WFM layer.

18. The method of claim 17, wherein forming the second contact structure further comprises depositing a capping layer on the n-type WFM layer prior to depositing the p-type WFM layer.

19. The method of claim 17, wherein forming the S/D region comprises:
- forming a first region with a first dopant concentration adjacent to the first contact structure; and
- forming a second region with a second dopant concentration adjacent to the second contact structure, wherein the second dopant concentration is greater than the first dopant concentration.

20. The method of claim 17, wherein forming the second contact structure further comprises:
- forming an opening in the S/D region through the second surface of the S/D region; and
- forming spacers along sidewalls of the opening and on the S/D region.

* * * * *